US012044957B2

(12) United States Patent
Oguri

(10) Patent No.: US 12,044,957 B2
(45) Date of Patent: *Jul. 23, 2024

(54) LIGHT SOURCE UNIT, PROJECTION DISPLAY DEVICE, AND METHOD FOR MANUFACTURING LIGHT SOURCE UNIT

(71) Applicant: HAMAMATSU PHOTONICS K.K., Hamamatsu (JP)

(72) Inventor: Akihiro Oguri, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/123,558

(22) Filed: Mar. 20, 2023

(65) Prior Publication Data
US 2023/0229069 A1    Jul. 20, 2023

Related U.S. Application Data

(63) Continuation of application No. 17/417,502, filed as application No. PCT/JP2019/048571 on Dec. 11, 2019, now Pat. No. 11,635,674.

(30) Foreign Application Priority Data

Dec. 28, 2018 (JP) ................. 2018-247888

(51) Int. Cl.
G03B 21/20 (2006.01)
G02B 7/02 (2021.01)
(Continued)

(52) U.S. Cl.
CPC ......... *G03B 21/2046* (2013.01); *G02B 7/023* (2013.01); *G03B 21/208* (2013.01);
(Continued)

(58) Field of Classification Search
CPC ...... G03B 21/20; G03B 21/28; G03B 21/145; G03B 21/208; G03B 21/2046;
(Continued)

(56) References Cited

U.S. PATENT DOCUMENTS 6,741,629 B1    5/2004    Garnache et al.
6,795,461 B1    9/2004    Blair et al.
(Continued)

FOREIGN PATENT DOCUMENTS

CN    1592864 A       3/2005
CN    103364895 A    10/2013
(Continued)

OTHER PUBLICATIONS

International Preliminary Report on Patentability mailed Jul. 8, 2021 for PCT/JP2019/048571.

*Primary Examiner* — Sultan Chowdhury
(74) *Attorney, Agent, or Firm* — Faegre Drinker Biddle & Reath LLP

(57) ABSTRACT

The light source unit includes a base provided with an opening, a support member fixed to the base at the opening, and a light source assembly fixed to the support member at the opening. The light source assembly includes a light source emitting laser light, a lens disposed on an optical axis of the laser light, and a holding member holding the light source and the lens. The support member has a convex receiving surface extending along the spherical surface so as to surround the optical axis when viewed from a direction parallel to the optical axis. The light source assembly is fixed to the support member by coupling the holding member to the receiving surface at a contact portion with the receiving surface. The receiving surface has a portion located on a side away from the optical axis with respect to a coupling part with the holding member.

22 Claims, 14 Drawing Sheets

(51) Int. Cl.
   *H01S 5/0239* (2021.01)
   *H04N 9/31* (2006.01)
   *G02B 5/02* (2006.01)
   *G02B 27/01* (2006.01)
   *G02B 27/14* (2006.01)

(52) U.S. Cl.
   CPC ......... *H01S 5/0239* (2021.01); *H04N 9/3129* (2013.01); *H04N 9/3141* (2013.01); *G02B 5/0278* (2013.01); *G02B 27/0101* (2013.01); *G02B 27/141* (2013.01)

(58) Field of Classification Search
   CPC ............. G03B 21/2053; H04N 9/3129; H04N 9/3141; H04N 9/3152; H04N 9/3155; H04N 9/3161; H01S 5/02; H01S 5/024; H01S 5/02212; H01S 5/005; H01S 5/0071; H01S 5/4025
   See application file for complete search history.

(56) References Cited

U.S. PATENT DOCUMENTS

| | | |
|---|---|---|
| 9,130,336 B2 | 9/2015 | Schmidt |
| 2003/0039036 A1 | 2/2003 | Kruschwitz et al. |
| 2011/0033979 A1 | 2/2011 | Haba et al. |
| 2012/0147602 A1 | 6/2012 | Someno et al. |
| 2015/0234263 A1 | 8/2015 | Yamagiwa et al. |
| 2015/0369991 A1 | 12/2015 | Bauco et al. |
| 2018/0364480 A1* | 12/2018 | Furuya ................. H04N 9/3129 |
| 2019/0219233 A1 | 7/2019 | Morimoto et al. |
| 2020/0064721 A1* | 2/2020 | Shimizu ................ H04N 9/3161 |
| 2020/0379205 A1* | 12/2020 | Futami ................... G02B 7/021 |
| 2021/0296860 A1 | 9/2021 | Futami |

FOREIGN PATENT DOCUMENTS

| | | |
|---|---|---|
| CN | 107407472 A | 11/2017 |
| CN | 106168731 B | 12/2018 |
| EP | 2966494 A1 | 1/2016 |
| JP | 2004-126533 A | 4/2004 |
| JP | 2004-207410 A | 7/2004 |
| JP | 2005-311203 A | 11/2005 |
| JP | 2006-054436 A | 2/2006 |
| JP | 2009-164427 A | 7/2009 |
| JP | 2010-263070 A | 11/2010 |
| JP | 2011-151308 A | 8/2011 |
| JP | 2012-247529 A | 12/2012 |
| JP | 2014-053401 A | 3/2014 |
| JP | 2015-194705 A | 11/2015 |
| JP | 2015-225969 A | 12/2015 |
| JP | 2016-006496 A | 1/2016 |
| JP | 2018-018034 A | 2/2018 |
| TW | 201737509 | 10/2017 |
| WO | WO-2004/001477 A1 | 12/2003 |
| WO | WO 2011/033979 A1 | 3/2011 |
| WO | WO 2014/103462 A1 | 7/2014 |

* cited by examiner

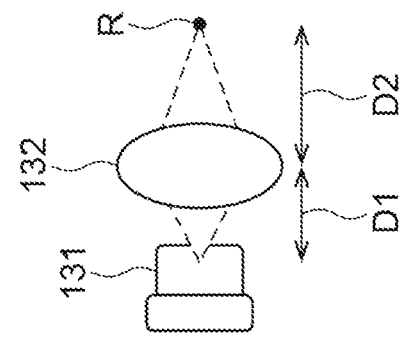
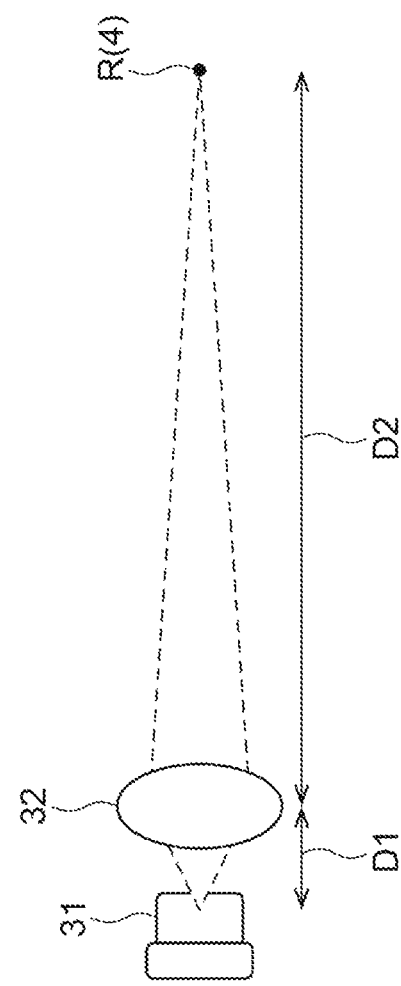

LIGHT SOURCE UNIT, PROJECTION DISPLAY DEVICE, AND METHOD FOR MANUFACTURING LIGHT SOURCE UNIT

CROSS-REFERENCE TO RELATED APPLICATIONS

This application is a continuation application of U.S. application Ser. No. 17/417,502, filed Jun. 23, 2021, which is a National Stage Entry of PCT/JP2019/048571, filed Dec. 11, 2019, which claims the benefit of priority to Japanese Patent Application No. 2018-247888, filed Dec. 28, 2028, the entire contents of which are incorporated herein by reference.

TECHNICAL FIELD

An aspect of the present disclosure relates to a light source unit, a projection display device, and a method for manufacturing a light source unit.

BACKGROUND ART

There has been light source units that include a base provided with an opening, a cylindrical support member fixed to the base at the opening, and a light source assembly fixed to the support member at the opening (for example, see Patent Literature 1, 2). The light source assembly includes a light source that emits laser light and a lens disposed on an optical axis of the laser light. The laser light emitted from the light source is condensed by the lens and passes through the opening of the base.

CITATION LIST

Patent Literature

Patent Literature 1: Japanese Unexamined Patent Publication No. 2010-263070
Patent Literature 2: Japanese Unexamined Patent Publication No. 2011-151308

SUMMARY OF INVENTION

Technical Problem

In the light source units as described above, extremely high accuracy is required for the position of the optical axis of the laser light. Therefore, it is an object of an aspect of the present disclosure to provide a light source unit and a projection display device in which the positional accuracy of the optical axis of the laser light is improved, and a method for manufacturing such a light source unit.

Solution to Problem

A light source unit according to an aspect of the present disclosure includes: a base provided with an opening; a support member fixed to the base at the opening; a light source assembly fixed to the support member at the opening; in which the light source assembly includes a light source that emits laser light, a lens disposed on an optical axis of the laser light, and a holding member that holds the light source and the lens, the support member has a convex receiving surface extending along a spherical surface so as to surround the optical axis when viewed from a direction parallel to the optical axis, the light source assembly is fixed to the support member by coupling the holding member to the receiving surface at a contact portion with the receiving surface, and the receiving surface has a portion located on a side away from the optical axis with respect to a coupling part with the holding member.

In this light source unit, the support member has a convex receiving surface extending along a spherical surface so as to surround the optical axis of the laser light when viewed from a direction parallel to the optical axis. The light source assembly is fixed to the support member by coupling the holding member to the receiving surface at a contact portion with the receiving surface. When the light source unit is manufactured, for example, the inclination of the light source assembly can be adjusted by sliding the holding member with respect to the receiving surface. Further, the position of the light source assembly can be adjusted by sliding the support member together with the light source assembly with respect to the base. Therefore, the position of the optical axis of the laser light can be adjusted with high accuracy. Further, in this light source unit, the receiving surface has a portion located on the side away from the optical axis with respect to the coupling part with the holding member. Accordingly, the holding member can be easily coupled to the receiving surface, and the position of the optical axis of the laser light can be prevented from being shifted when the holding member is coupled to the receiving surface. As described above, in this light source unit, the positional accuracy of the optical axis of the laser light is improved.

The holding member may include a cylindrical main body surrounding the optical axis and a protruding portion protruding from the main body so as to be away from the optical axis, and may be in contact with and coupled to the receiving surface at the protruding portion. In this case, the position of the optical axis of the laser light can be adjusted more accurately, and the holding member can be more easily coupled to the receiving surface.

The holding member may have an inclined surface inclined with respect to the optical axis, and may be in contact with and coupled to the receiving surface at the inclined surface. In this case, the position of the optical axis of the laser light can be adjusted more accurately, and the holding member can be more easily coupled to the receiving surface.

The holding member may be in line contact with the receiving surface. In this case, the position of the optical axis of the laser light can be adjusted more accurately, and the holding member can be more easily coupled to the receiving surface.

The holding member may have a concave contact surface extending along the spherical surface, and may be in contact with and coupled to the receiving surface at the contact surface. Also in this case, the position of the optical axis of the laser light can be adjusted with high accuracy, and the holding member can be easily coupled to the receiving surface.

The holding member may be coupled to the receiving surface by laser welding. In this light source unit, the holding member can be easily coupled to the receiving surface by laser welding.

The holding member may have a first portion disposed in a space defined by the support member. In this case, the light source unit can be downsized.

The holding member may have a second portion disposed in the opening of the base. In this case, the light source unit can be further downsized.

The light source assembly and the support member may be configured such that a portion of the first portion on a side opposite to the base contacts the support member before a portion of the first portion on a side of the base contacts the support member when the holding member is slid with respect to the receiving surface such that the optical axis is gradually inclined with respect to a central axis of the opening in a state where the holding member is not coupled to the receiving surface. In this case, when the inclination of the light source assembly is adjusted by sliding the holding member with respect to the receiving surface, the portion of the first portion on the side of the base can be prevented from coming into contact with the support member. As a result, it is possible to prevent the position of the lens held on the base side in the holding member from shifting.

The holding member may include a light source holder that holds the light source and a lens holder that holds the lens, the light source holder may be provided with a first screw portion, and the lens holder may be provided with a second screw portion that is screwed with the first screw portion so that the light source holder and the lens holder are relatively movable in a direction parallel to the optical axis. In this case, when the light source unit is manufactured, the distance between the light source and the lens in the direction parallel to the optical axis can be adjusted by adjusting the amount of screwing between the first screwing portion and the second screwing portion.

A distance from a center of curvature of the receiving surface to the lens on the optical axis may be shorter than a distance from a light emitting point of the light source to the lens on the optical axis. In this case, the amount of movement of the lens when the inclination of the light source assembly is adjusted by sliding the holding member with respect to the receiving surface can be reduced.

The holding member may be made of the same material as the support member. In this case, since the holding member and the support member have the same thermal expansion coefficient, positional deviation between the holding member and the support member due to a change in ambient temperature can be suppressed.

The light source unit according to an aspect of the present disclosure may further include a dichroic mirror on which the laser light emitted from the lens is incident, and the dichroic mirror may be bonded to the base by resin. In this case, the manufacture of the light source unit can be simplified.

The light source assembly and the support member may be configured such that the receiving surface has a portion located on a side away from the optical axis with respect to a contact portion with the holding member over an entire circumference when the holding member is slid with respect to the receiving surface to a position where the optical axis is maximally inclined with respect to a central axis of the opening in a state where the holding member is not coupled to the receiving surface. In this case, the position of the optical axis of the laser light can be adjusted more accurately, and the holding member can be more easily coupled to the receiving surface.

The receiving surface may have a portion located outside the holding member when viewed from a direction parallel to the optical axis. In this case, the position of the optical axis of the laser light can be adjusted more accurately, and the holding member can be more easily coupled to the receiving surface.

In a cross section including the optical axis, a tangent line of the receiving surface at a contact point between the holding member and the receiving surface may form an obtuse angle with an outer surface of the holding member continuous with the contact point. In this case, the position of the optical axis of the laser light can be adjusted more accurately, and the holding member can be more easily coupled to the receiving surface.

A projection display device according to an aspect of the present disclosure includes the light source unit described above and a light diffuser that transmits and diffuses laser light emitted from the light source unit. In this projection display device, the positional accuracy of the optical axis of the laser light is enhanced for the reasons described above.

A method for manufacturing a light source unit according to an aspect of the present disclosure including: a distance adjusting step of adjusting, in a holding member of a light source assembly including a light source that emits a laser light, a lens disposed on an optical axis of the laser light and the holding member that holds the light source and the lens, a distance between the light source and the lens in a direction parallel to the optical axis of the laser light by adjusting a screwing amount between a light source holder holding the light source and a lens holder holding the lens; a disposing step of disposing a cylindrical support member on a base provided with an opening, the cylindrical support member having a convex receiving surface extending along a spherical surface so as to surround the optical axis when viewed from a direction parallel to the optical axis, and disposing the light source assembly on the support member such that the holding member is in contact with the receiving surface, after the distance adjusting step; an inclination adjusting step of adjusting an inclination of the light source assembly by sliding the holding member with respect to the receiving surface, after the disposing step; and a fixing step of fixing the light source assembly to the support member at the opening by fixing the support member to the base at the opening and coupling the holding member to the receiving surface at a contact portion with the receiving surface, after the inclination adjusting step.

In this method for manufacturing a light source unit, the distance between the light source and the lens in the direction parallel to the optical axis of the laser light is adjusted by adjusting the amount of screwing between the light source holder and the lens holder (distance adjusting step). Accordingly, the positional relationship between the light source and the lens can be adjusted with high accuracy. After the inclination of the light source assembly is adjusted by sliding the holding member with respect to the receiving surface (inclination adjusting step), the support member is fixed to the base, and the light source assembly is fixed to the support member by coupling the holding member to the receiving surface at a contact portion with the receiving surface (fixing step). Thus, each element can be fixed after the position of the optical axis of the laser light is accurately adjusted. Therefore, according to the method for manufacturing the light source unit, it is possible to obtain the light source unit in which the positional accuracy of the optical axis of the laser light is improved.

The light source unit according to an aspect of the present disclosure may further include a position adjusting step of adjusting the position of the light source assembly by sliding the support member together with the light source assembly with respect to the base, between the disposing step and the fixing step. In this case, each element can be fixed after the position of the optical axis of the laser light is adjusted more accurately.

In the fixing step, the light source assembly may be fixed to the support member by coupling the holding member to the receiving surface at a coupling-planned portion in a state in which the receiving surface has a portion located on a side away from the optical axis with respect to the coupling-planned portion with the holding member. In this case, the positional accuracy of the optical axis of the laser light can be further improved.

In the fixing step, the light source assembly may be fixed to the support member by coupling the holding member to the receiving surface at a contact portion with the receiving surface by laser welding. According to this method for manufacturing a light source unit, even when the holding member is coupled to the receiving surface by laser welding, the positional accuracy of the optical axis of the laser light can be improved.

Advantageous Effects of Invention

According to an aspect of the present disclosure, it is possible to provide a light source unit and a projection display device in which the positional accuracy of the optical axis of laser light is improved, and a method for manufacturing such a light source unit.

BRIEF DESCRIPTION OF DRAWINGS

FIG. 12A is a diagram illustrating a case in which the condensing distance of the lens is long, and FIG. 12B is a diagram illustrating a case in which the condensing distance of the lens is short.

DESCRIPTION OF EMBODIMENTS

Figure 1:
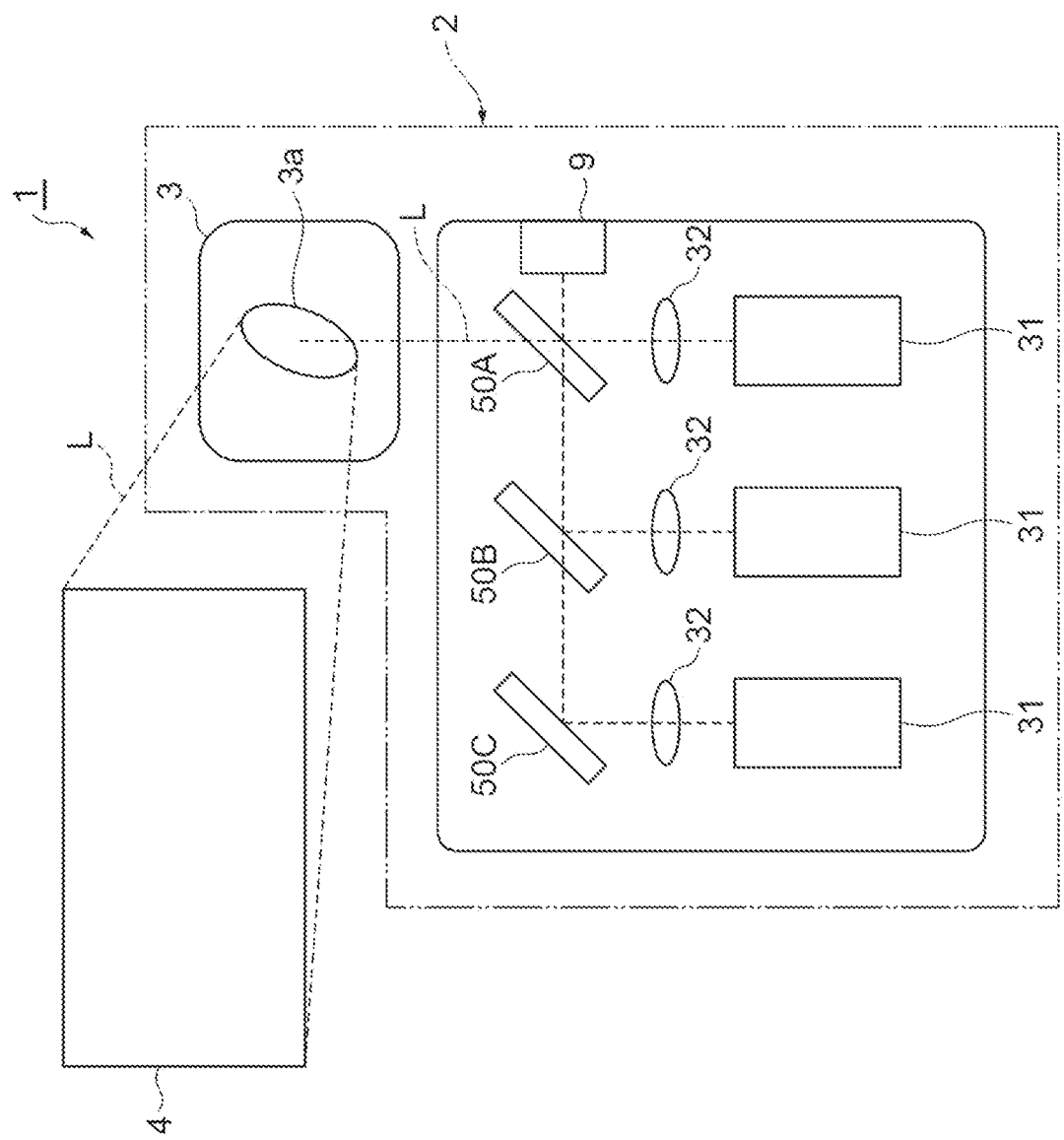
FIG. 1 is a schematic configuration diagram of a projection display device according to an embodiment.
Figure 2:
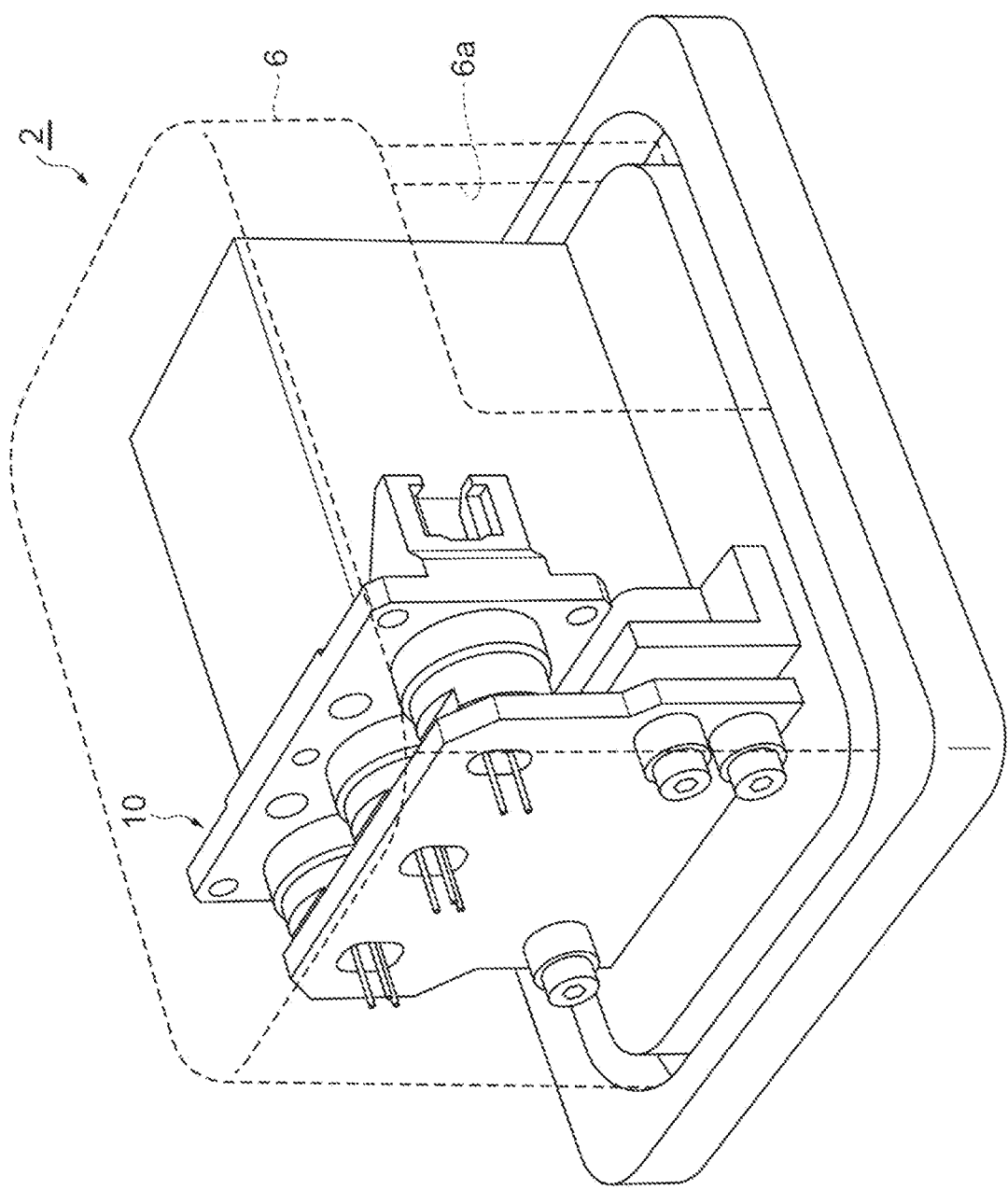
FIG. 2 is a perspective view of a light source device.
Figure 3:
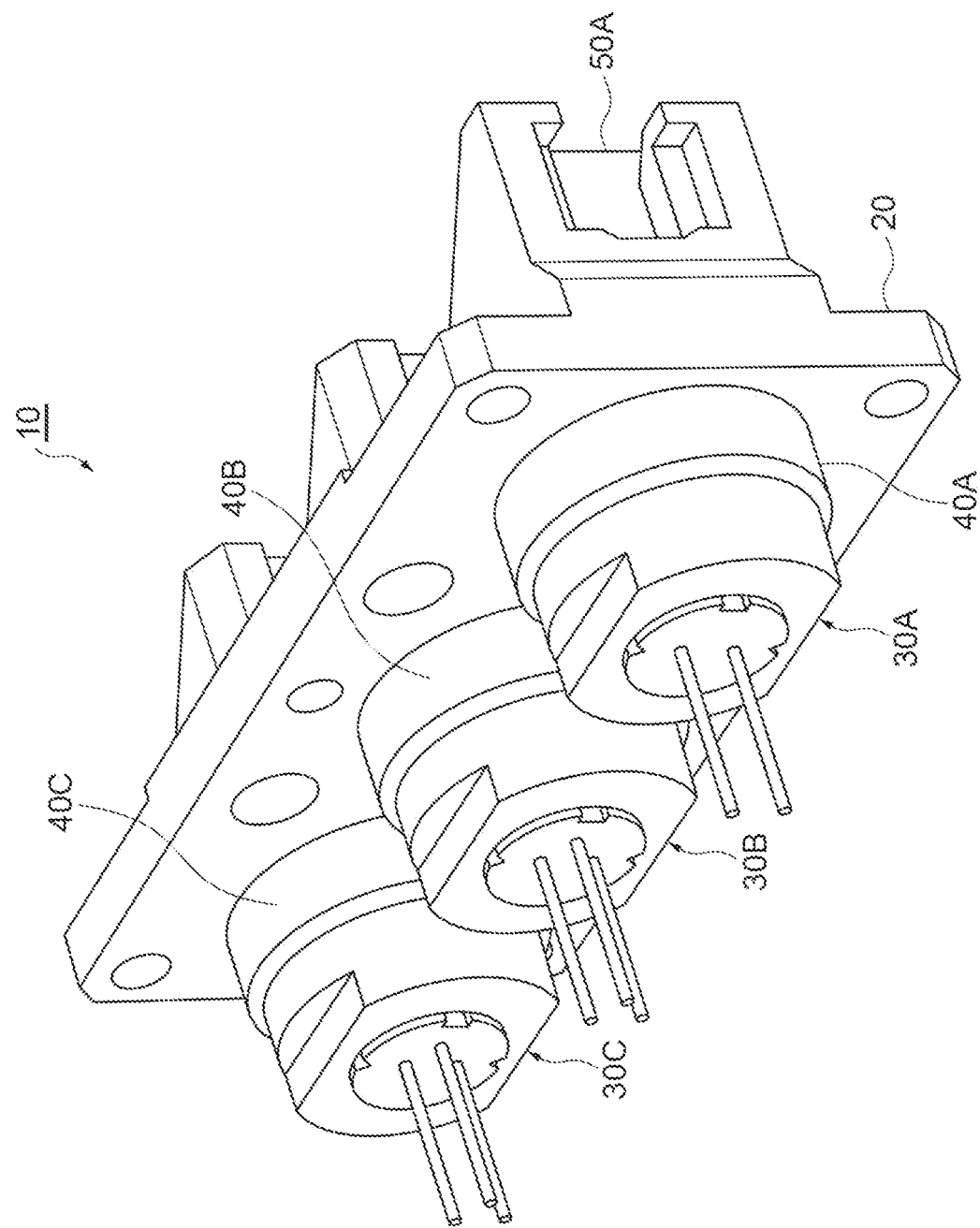
FIG. 3 is a perspective view of a light source unit as viewed from one side.

Hereinafter, an embodiment of the present disclosure will be described in detail with reference to the drawings. In the following description, the same reference numerals are used for the same or corresponding element, and redundant description is omitted.

[Projection Display Device]

As shown in FIG. 1, the projection display device 1 includes a light source device 2 and a light diffuser 4. The projection display device 1 is, for example, a laser-scanning projection display (head-up display) mounted on an automobile, and projects and displays an image on the windshield of the automobile. The light source device 2 emits laser light L for projection display.

The light source device 2 includes a scanning mirror 3. The scanning mirror 3 is, for example, an electromagnetically driven optical mirror manufactured by MEMS (Micro Electro Mechanical Systems) technology. By swinging the mirror 3a, the scanning mirror 3 reflects the laser light L emitted from the light source device 2 and scans the laser light L in a predetermined region of the light diffuser 4.

The light diffuser 4 is, for example, a microlens array having a plurality of microlenses arranged in matrix, and transmits and diffuses the laser light L for projection display scanned by the scanning mirror 3. The incident surface of the light diffuser 4 is a flat surface, and the emission surface of the light diffuser 4 is constituted by a plurality of convex surfaces corresponding to the plurality of microlenses. The laser light L diffused by the light diffuser 4 is guided to the windshield of the automobile via, for example, a plurality of mirrors, and reaches the eyes of the driver as an image via reflection at the windshield.

[Light Source Device]

As shown in FIGS. 1 to 5, the light source device 2 includes, in addition to the scanning mirror 3, a light source unit 10, and a box-shaped housing 6 that accommodates the scanning mirror 3 and the light source unit 10. The housing 6 is provided with a light emission window 6a through which light is emitted from the light source device 2 to the outside.

The light source unit 10 includes a base 20, three light source assemblies 30A, 30B, and 30C, three support members 40A, 40B, and 40C, and three dichroic mirrors 50A, 50B, and 50C. The light source assemblies 30A, 30B, and 30C, the support members 40A, 40B, and 40C, and the dichroic mirrors 50A, 50B, and 50C are fixed to the base 20.

[Light Source Assembly]

Figure 6:
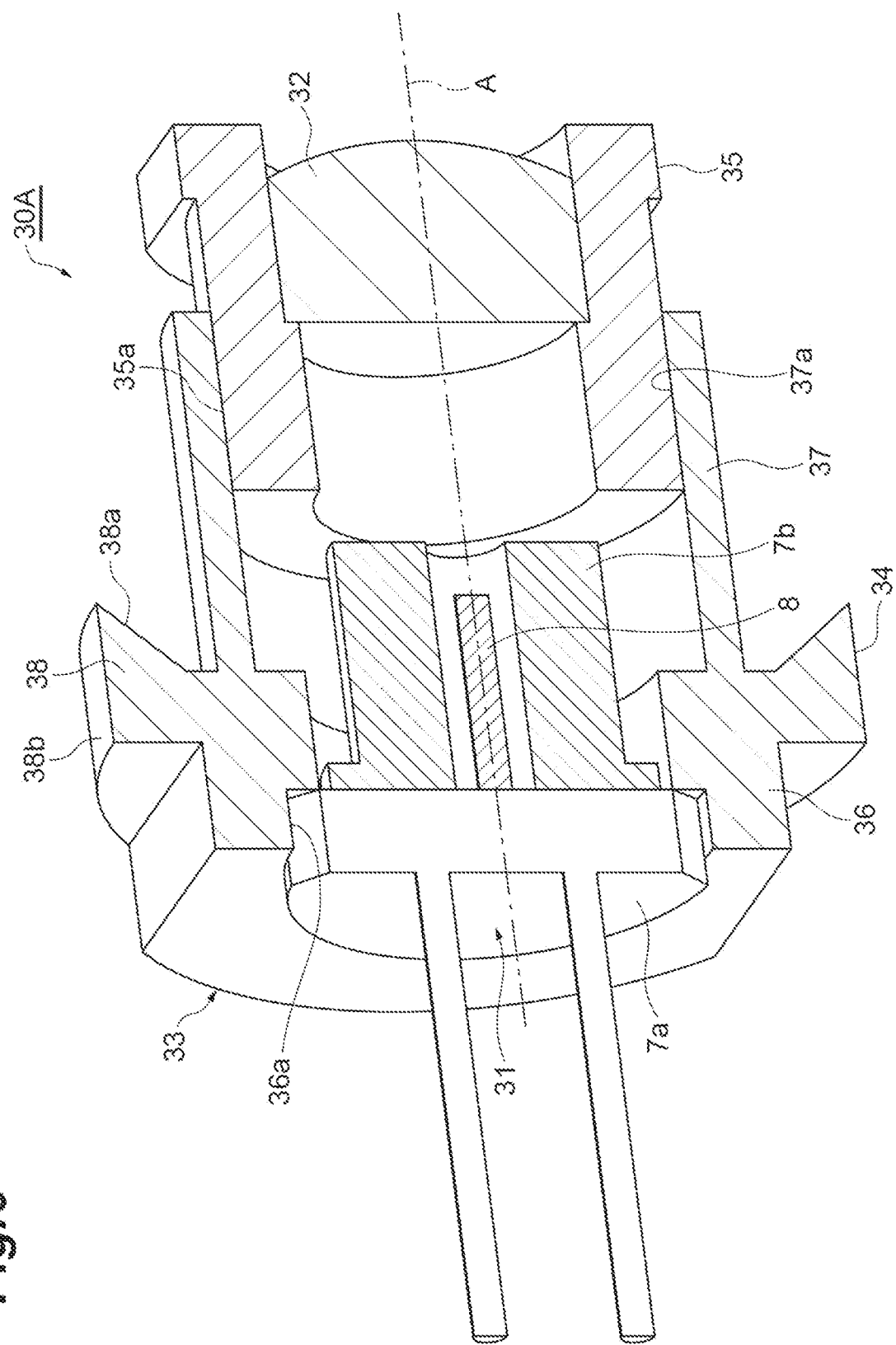
FIG. 6 is a sectional view of a light source assembly.

Each of the light source assemblies 30A, 30B, and 30C includes a light source 31 that emits laser light L, a lens 32 disposed on an optical axis A of the laser light L, and a holding member 33 that integrally holds the light source 31 and the lens 32. Hereinafter, the light source assembly 30A will be described with reference to FIG. 6, but the light source assemblies 30B and 30C have a similar configuration with the light source assembly 30A.

The light source 31 is, for example, a red laser diode, and emits laser light L for projection display. The light source 31 of the light source assembly 30B is, for example, a green laser diode, and the light source 31 of the light source assembly 30C is, for example, a blue laser diode. Each laser diode has, for example, a configuration in which a laser chip 8 is disposed in a package 7 including a stem 7a and a cap 7b, and emits laser light L from a light emission window provided in the cap 7b. The lens 32 is, for example, a convex lens and is a condensing lens that condenses the laser light L. The lens 32 is used to obtain a predetermined beam characteristic (spot size).

The holding member 33 includes a light source holder 34 that holds the light source 31 and a lens holder 35 that holds the lens 32. The holding member 33 is made of a metal material such as stainless steel or the like. The light source holder 34 includes a fixing portion 36 to which the light source 31 is fixed, and an extending portion 37 extending cylindrically from the fixing portion 36. The light source holder 34 is formed in a substantially cylindrical shape as a whole, and surrounds the optical axis A of the light source 31. The light source 31 is fixed to the fixing portion 36 at an opening 36a provided in the fixing portion 36. The light source 31 emits laser light L toward the lens 32. A screw groove (first screw portion) 37a extending spirally around the optical axis A is provided on the inner peripheral surface of the extending portion 37.

A protruding portion 38 protruding from the fixing portion 36 so as to be away from the optical axis A is provided on the outer peripheral surface of the fixing portion 36. In this example, the protruding portion 38 is disposed over the entire circumference of the outer circumferential surface of the fixing portion 36 and is formed in a substantially cylindrical shape. The projection 38 is provided with an inclined surface 38a inclined with respect to the optical axis A. The inclined surface 38a is, for example, a flat surface and extends in an annular shape when viewed from a direction parallel to the optical axis A (hereinafter, also referred to as an "optical axis direction"). The inclined surface 38a is inclined so as to go toward the light emission side (the side where the lens 32 is located with respect to the light source 31 in the optical axis direction) as the distance from the optical axis A increases. An angle formed by the inclined surface 38a and the optical axis A in the cross section including the optical axis A is, for example, about 50 degrees. In this example, the outer edge of the inclined surface 38a is directly continuous with the outer surface of the protruding portion 38.

The lens holder 35 is formed in a substantially cylindrical shape as a whole, and surrounds the optical axis A. The lens 32 is disposed in the lens holder 35 and fixed to the lens holder 35. A screw thread (second screw portion) 35a to be screwed with the screw groove 37a is provided on the outer peripheral surface of the lens holder 35. The screw thread 35a extends spirally around the optical axis A. A part of the lens holder 35 is inserted into the extending portion 37 of the light source holder 34, and the lens holder 35 is fixed to the light source holder 34 by screwing the screw thread 35a into the screw groove 37a. The light source holder 34 and the lens holder 35 can be moved relative to each other in the optical axis direction by adjusting the amount of screwing between the screw thread 35a and the screw groove 37a.

When the light source assembly 30A is assembled, the light source holder 34 and the lens holder 35 are moved relative to each other by adjusting the amount of screwing between the screw thread 35a and the screw groove 37a, so that the distance between the light source 31 and the lens 32 in the optical axis direction can be adjusted. The accuracy of the adjustment depends on the pitch of the thread 35a and the thread groove 37a. For example, when the pitch is 0.5 mm, the distance adjustment amount by the relative rotation of 1 degree is about 1.4 μm obtained by dividing 0.5 mm by 360 degrees. Therefore, for example, by using a jig capable of adjusting an angle of about 1 degree, the positional relationship between the light source 31 and the lens 32 can be adjusted with a resolution of about several micrometers.

In this example, the light source holder 34 and the lens holder 35 are also fixed to each other by a thermosetting resin provided between the screw thread 35a and the screw groove 37a. That is, when the light source assembly 30A is assembled, a thermosetting resin may be applied in advance between the screw thread 35a and the screw groove 37a, and the thermosetting resin may be heated and cured after the position between the light source 31 and the lens 32 is adjusted. As a result, the light source holder 34 and the lens holder 35 can be fixed more firmly. In addition to or instead of this, the light source holder 34 and the lens holder 35 can be fixed more firmly by making the tightening torque of the screw thread 35a and the screw groove 37a larger than that of a general screw structure.

As described above, the holding member 33 includes the cylindrical main body surrounding the optical axis A and the protruding portion 38 protruding from the main body so as to be away from the optical axis A. In this example, the main body is formed by the fixing portion 36 and the extending portion 37 of the light source holder 34 and the lens holder 35.

Figure 5:
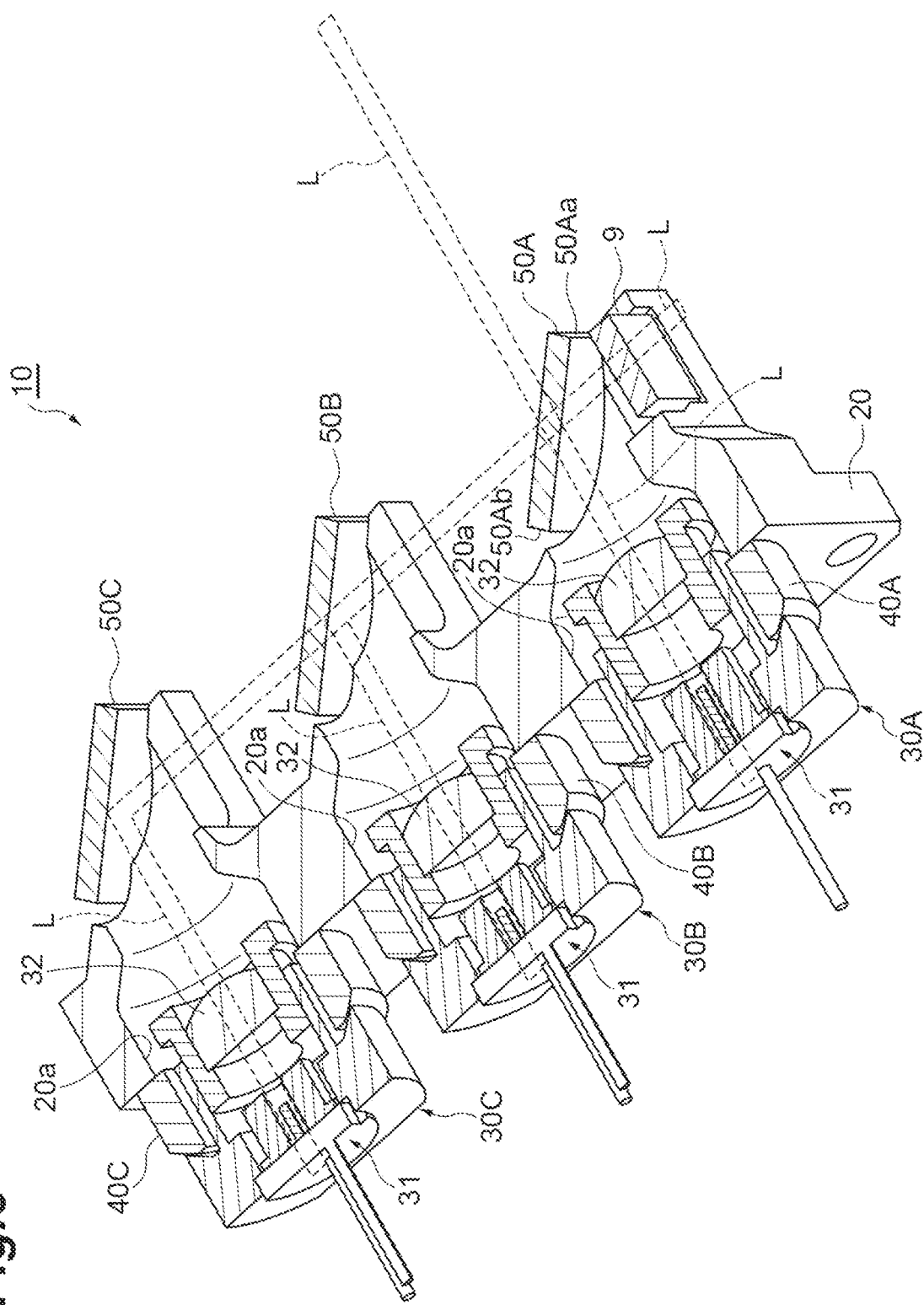
FIG. 5 is a sectional view of a light source unit.
Figure 7:
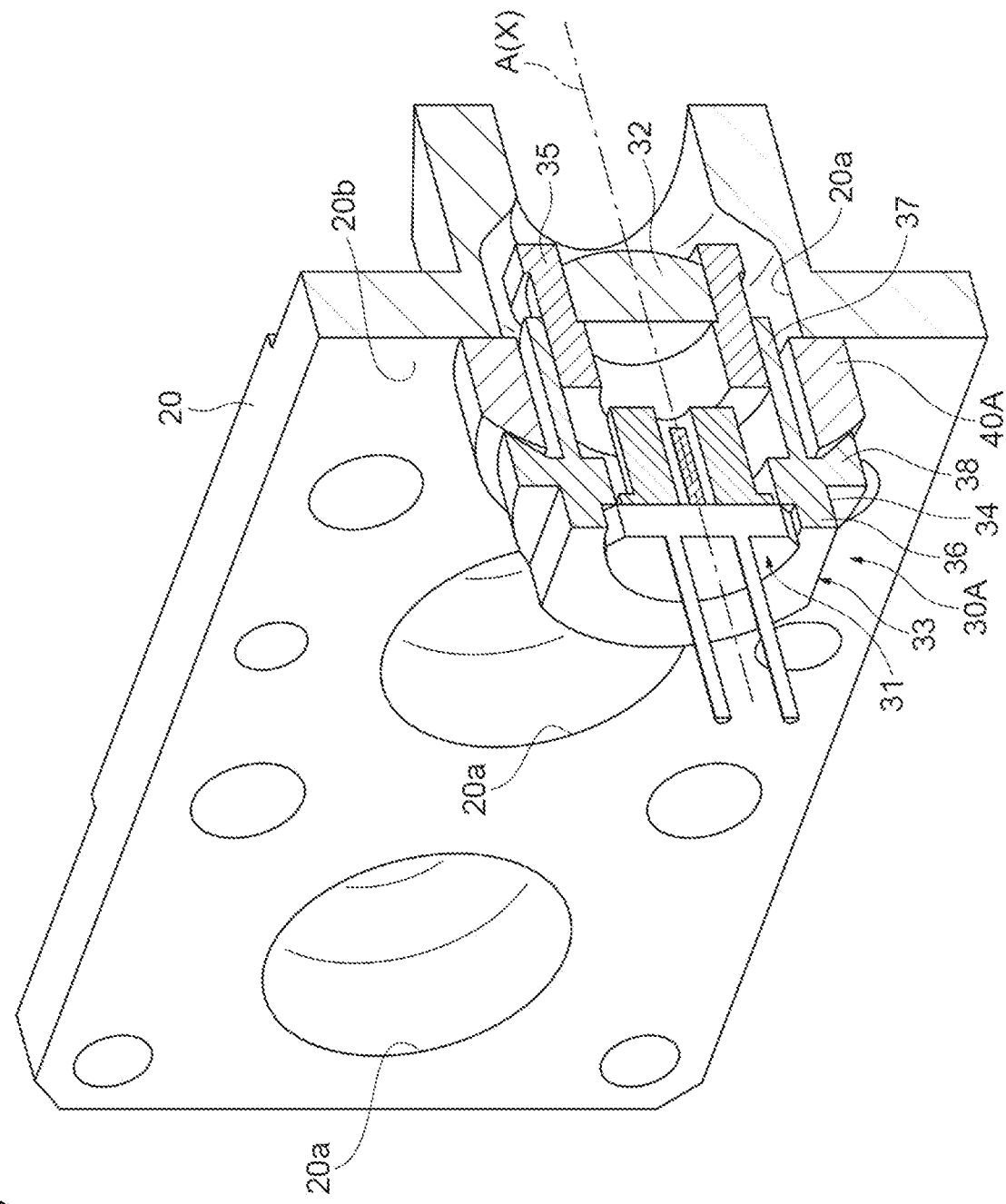
FIG. 7 is a sectional view showing a fixing structure of the light source assembly.

As shown in FIGS. 5 and 7, the light source assemblies 30A, 30B, and 30C are fixed to the base 20 at three openings 20a provided in the base 20 respectively. The dichroic mirrors 50A, 50B, and 50C are disposed so as to face the light source assemblies 30A, 30B, and 30C, respectively, via the openings 20a. The dichroic mirrors 50A, 50B, and 50C are bonded to the base 20 by resin. As the resin material for the adhesion, for example, a epoxy resin having a thermosetting characteristic can be used.

The laser light L emitted from the light sources 31 of the light source assemblies 30A, 30B, and 30C enter the dichroic mirrors 50A, 50B, and 50C via the lenses 32 and the openings 20a, respectively. The laser light L from the light source assemblies 30A, 30B, and 30C are multiplexed (combined) by the dichroic mirror 50A, and reach the scanning mirror 6 via the light emission window 6a.

More specifically, the laser light L emitted from the light source 31 of the light source assembly 30A is reflected by the dichroic mirror 50A and reaches the scanning mirror 3. The laser light L emitted from the light source 31 of the light source assembly 30B is reflected by the dichroic mirror 50B, passes through the dichroic mirror 50A, and reaches the scanning mirror 3. The laser light L emitted from the light source 31 of the light source assembly 30C is reflected by the dichroic mirror 50C, passes through the dichroic mirrors 50A and 50B, and reaches the scanning mirror 3.

A part of the combined laser light L passes through the dichroic mirror 50A. The light source unit 10 further includes a light amount sensor 9 that detects the laser light L transmitted through the dichroic mirror 50A. The light amount sensor 9 is, for example, a photodiode, and is used to monitor the light amount of the laser light L emitted from the light source unit 10. In this example, the light amount sensor 9 is fixed to the base 20.

[Light Source Unit]

The light source unit 10 will be further described with reference to FIGS. 7 to 11. Hereinafter, the fixing structure of the light source assembly 30A and the support member 40A to the base 20 will be described, but the fixing structure of the light source assemblies 30B and 30C and the support members 40B and 40C to the base 20 is configured in a similar manner.

Figure 8:
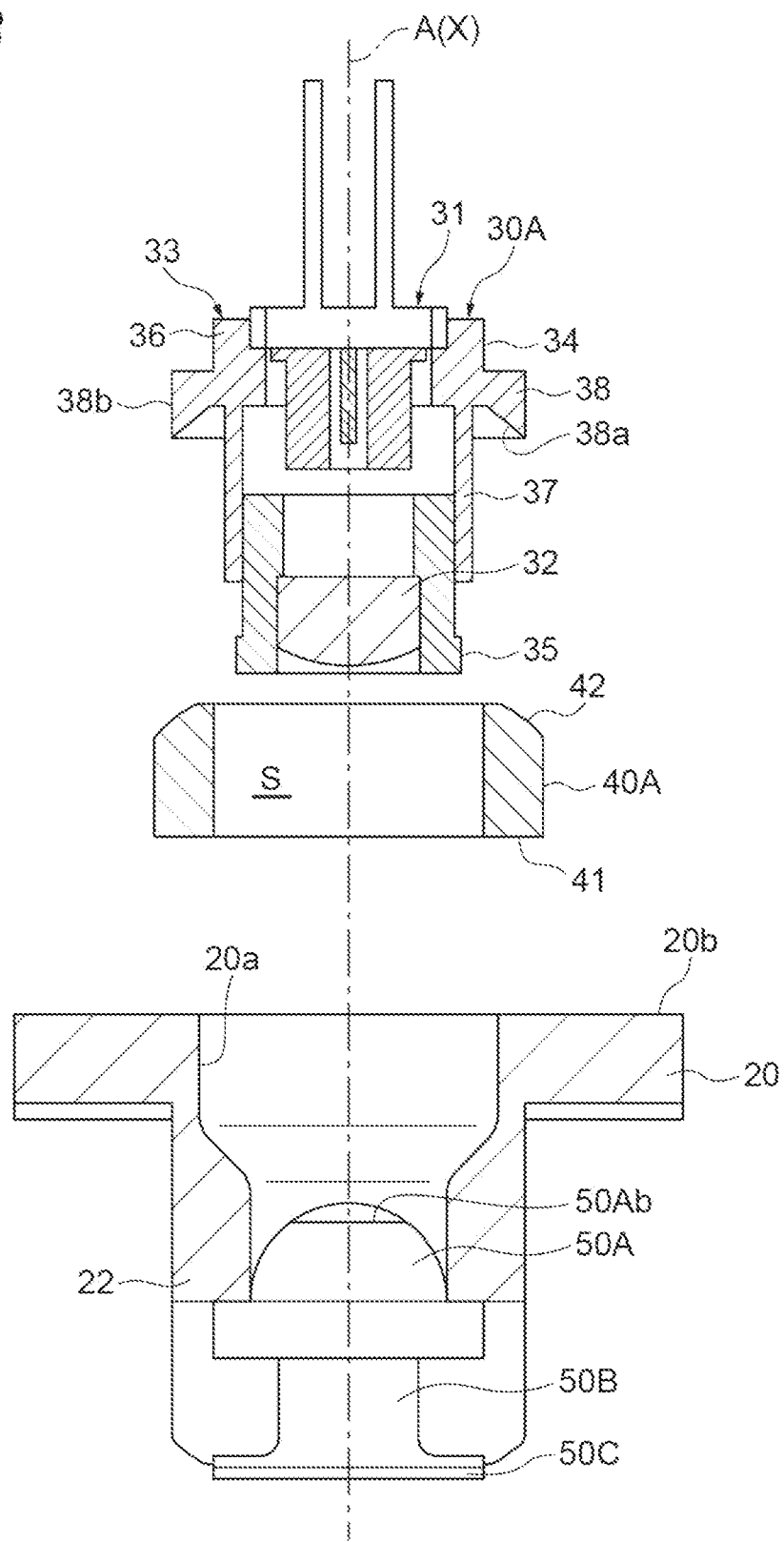
FIG. 8 is a sectional view of a light source unit before assembly.
Figure 9:
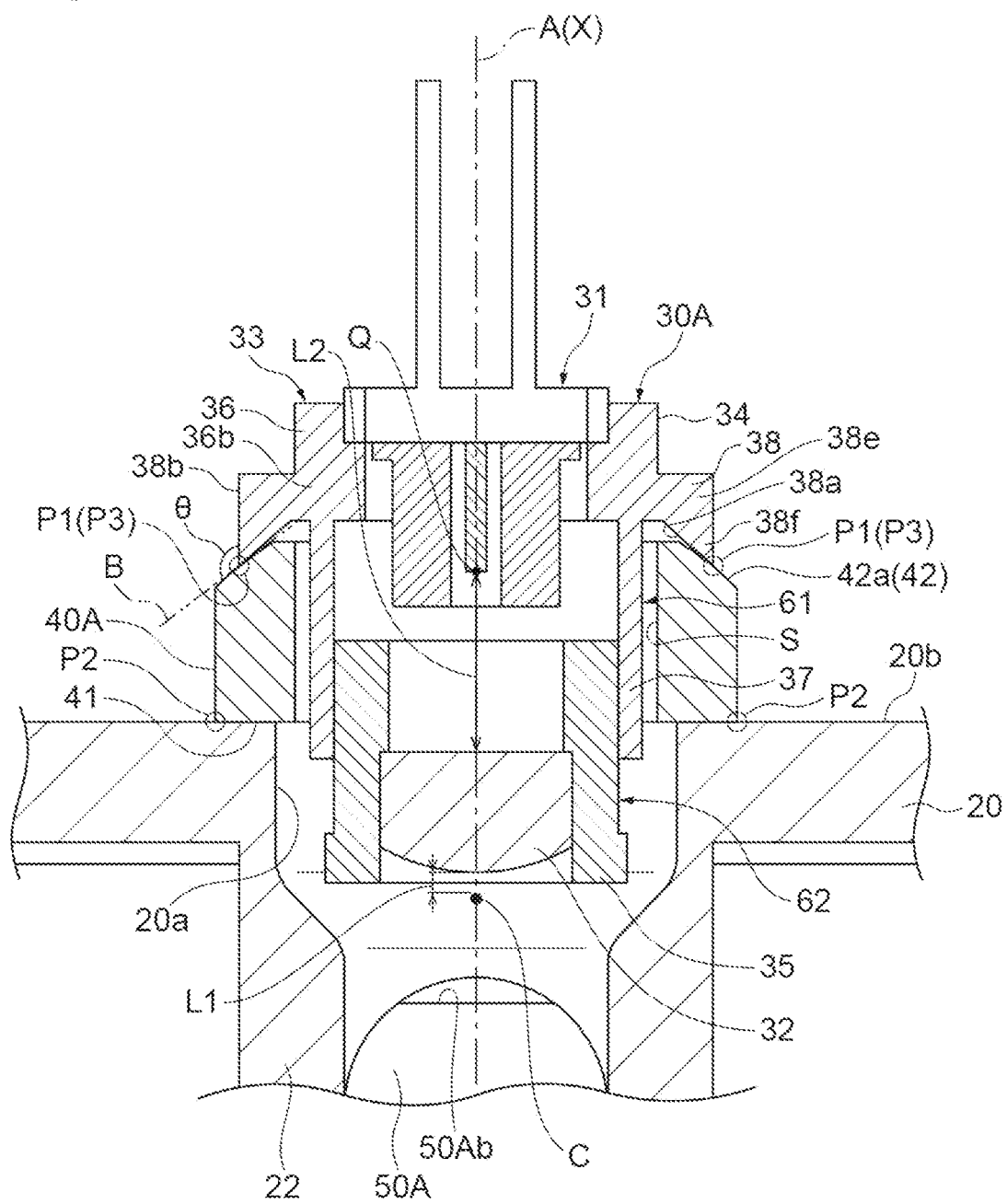
FIG. 9 is a sectional view of the light source unit after assembly.

The light source assembly 30A is fixed to the base 20 via a support member 40A. The support member 40A is interposed between the attaching surface 20b of the base 20 and the light source assembly 30A. The attaching surface 20b is, for example, a flat surface. The support member 40A is made of, for example, the same material as the holding member 33. FIGS. 7 to 9 illustrate a state in which the optical axis A of the light source 31 coincides with the central axis X of the opening 20a of the base 20.

The support member 40A has a sliding surface 41 and a receiving surface 42 in addition to a cylindrical outer peripheral surface. The sliding surface 41 is, for example, a flat surface and is in contact with the attaching surface 20b. The receiving surface 42 is a part of a surface of the support member 40A opposite to the base 20. The receiving surface 42 extends annularly and surrounds the optical axis A when viewed from the optical axis direction. The receiving surface 42 is a convex surface extending along a spherical surface, and has one center of curvature (spherical center) C. The center of curvature C is located on the optical axis A and is located on the light emission side with respect to the lens 32. A distance L1 from the center of curvature C to the lens 32 on the optical axis A is shorter than a distance L2 from the light emitting point Q of the light source 31 to the lens 32 on the optical axis A. In this example, the distance L1 is the distance from the center of curvature C to the surface of the lens 32 opposite to the light source 31 on the optical axis A. The distance L2 is a distance from the light emitting point Q to the surface of the lens 32 on the light source 31 side on the optical axis A. When the center of curvature C is located on the lens 32, the distance L1 is 0. The distance L1 may be equal to or less than the thickness of the lens 32. In this example, the outer edge of the receiving surface 42 is directly continuous with the outer peripheral surface of the support member 40A.

A part of the light source assembly 30A is disposed in the support member 40A and the opening 20a of the base 20. More particularly, the holding member 33 is disposed so as to penetrate the support member 40A and reach the opening 20a, and has a first portion 61 disposed in the space S defined by the support member 40A and a second portion 62 disposed in the opening 20a. In this example, the first portion 61 is constituted by a part of the extending portion 37 and the lens holder 35, and the second portion 62 is constituted by another part of the extending portion 37 and the lens holder 35.

The holding member 33 is in contact with the receiving surface 42 at the inclined surface 38a of the protruding portion 38. More specifically, the holding member 33 is in contact with the receiving surface 42 at the entire periphery of the outer edge of the inclined surface 38a. That is, the holding member 33 is in line contact with the receiving surface 42. The light source assembly 30A is fixed to the support member 40A by coupling the holding member 33 to the receiving surface 42 at a contact portion with the receiving surface 42. In this example, the holding member 33 is coupled to the receiving surface 38a at the outer edge of the inclined surface 42 by laser welding. The holding member 33 is coupled to the receiving surface 42 at, for example, four point-like coupling parts P1 shown in FIG. 10. The irradiation direction of the laser light in the laser welding is, for example, a direction along the optical axis direction.

The support member 40A is fixed to the base 20 by coupling the sliding surface 41 to the attaching surface 20b. In this example, the sliding surface 41 is coupled to the attaching surface 20b at the outer edge of the sliding surface 41 by laser welding. The support member 40A is coupled to the attaching surface 20b at, for example, four point-like coupling parts P2 shown in FIG. 10. The irradiation direction of the laser light in the laser welding is, for example, a direction along the optical axis direction.

The receiving surface 42 has an outer portion 42a located on a side away from the optical axis A of the light source 31 with respect to the coupling part P1 with the holding member 33. For example, the outer portion 42a extends in an annular shape when viewed from the optical axis direction. The outer portion 42a is located outside the holding member 33 when viewed from the optical axis direction. The outer portion 42a is exposed from the holding member 33 (not covered by the holding member 33). When viewed from either one of the optical axis direction and the direction perpendicular to the optical axis A, the coupling part P1 of the holding member 33 to the receiving surface 42 is exposed. In a cross section including the optical axis A (cross section shown in FIG. 9), an angle θ formed by a tangent line B of the receiving surface 42 at a contact point P3 between the holding member 33 and the receiving surface 42 and an outer surface (in this example, the outer peripheral surface 38b of the protruding portion 38) continuous with the contact point P3 in the holding member 33 is an obtuse angle. The angle θ is, for example, about 130 degrees.

[Method for Manufacturing Light Source Unit]

When the light source unit 10 is manufactured, first, the light source assembly 30A is assembled (assembly step). That is, the light source holder 34 holding the light source 31 and the lens holder 35 holding the lens 32 are prepared and assembled to each other. Subsequently, the distance between the light source 31 and the lens 32 in the optical axis direction is adjusted by adjusting the amount of screwing between the screw thread 35a and the screw groove 37a to relatively move the light source holder 34 and the lens holder 35 (distance adjusting step).

Figure 11:
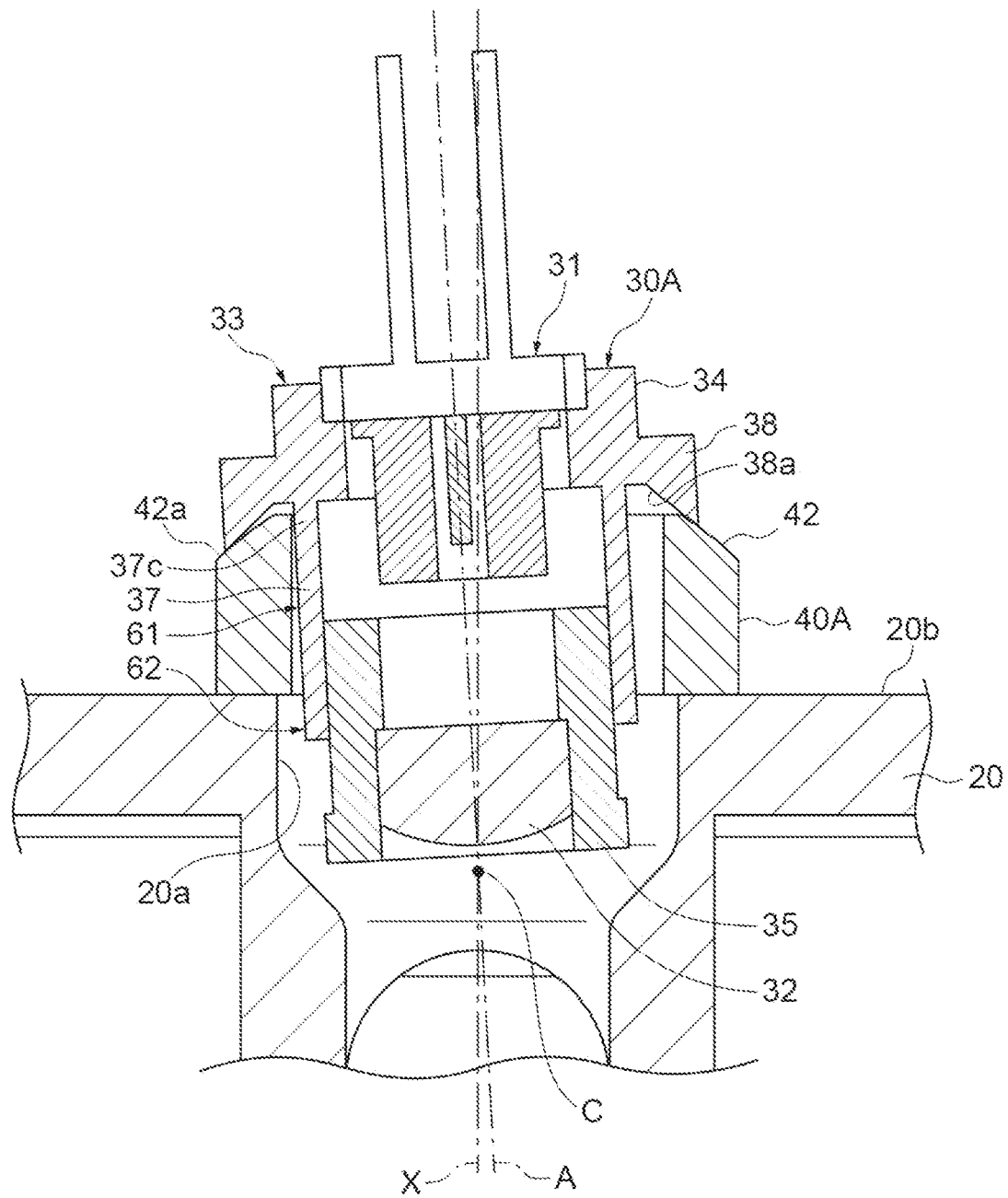
FIG. 11 is a sectional view illustrating a state in which the light source assembly is inclined.

Subsequently, the support member 40A is disposed on the attaching surface 20b of the base 20, and the light source assembly 30A is disposed on the support member 40A such that the holding member 33 is in contact with the receiving surface 42 (disposing step). Subsequently, the inclination of the light source assembly 30A is adjusted by sliding the holding member 33 with respect to the receiving surface 42 (inclination adjusting step). More specifically, the inclination of the light source assembly 30A with respect to the base 20 is adjusted by sliding the outer edge of the inclined surface 38a of the protruding portion 38 with respect to the receiving surface 42. Thus, the inclination angle of the optical axis A of the light source 31 with respect to the central axis X of the opening 20a can be adjusted. For example, FIG. 11 shows a state in which the optical axis A is inclined with respect to the central axis X.

Subsequently, by sliding the support member 40A together with the light source assembly 30A with respect to the attaching surface 20b of the base 20, the position of the light source assembly 30A with respect to the base 20 in the direction perpendicular to the optical axis A is adjusted (position adjusting step). Thus, the position of the optical axis A with respect to the central axis X can be adjusted.

The inclination adjusting step and the position adjusting step may be repeatedly performed such that the inclination angle and the position of the optical axis A with respect to the central axis X become a desired angle and position. Each of the inclination adjusting step and the position adjusting step may be performed once or a plurality of times. The inclination adjusting step and the position adjusting step may be performed in any order.

By the inclination adjusting step and the position adjusting step, the inclination angle and the position of the optical axis A with respect to the central axis X can be adjusted to a desired angle and position. Accordingly, for example, the laser light L is incident on the dichroic mirror 50A at a predetermined angle and position. These adjustments are necessary because the angle of the optical axis A may vary in the light source assembly 30A. In addition, the adjustment is necessary because the arrangement accuracy of the dichroic mirror 50A may vary due to the processing accuracy of the base 20.

Subsequently, the support member 40A is fixed to the base 20 at the opening 20a, and the light source assembly 30A is fixed to the support member 40A at the opening 20a (fixing step). In the fixing step, the support member 40A is fixed to the base 20 by joining the sliding surface 41 of the support member 40A to the attaching surface 20b of the base 20 by laser welding. In the fixing step, the light source assembly 30A is fixed to the support member 40A by joining the holding member 33 to the receiving surface 42 at the contact portion with the receiving surface 42 by laser welding. The laser welding is performed by coupling the holding member 33 to the receiving surface 42 at the coupling-planned portion in a state where the receiving surface 42 has a portion (outer portion 42a) located on a side away from the optical axis A with respect to the coupling-planned portion with the holding member 33.

Similarly, the light source assemblies 30B and 30C and the support members 40B and 40C are fixed to the base 20 in a state where the inclination angles and positions of the optical axes A with respect to the central axes X are adjusted to desired angles and positions by the assembling step, the distance adjusting step, the disposing step, the inclination adjusting step, the position adjusting step, and the fixing step. Accordingly, the inclination angles and positions of the optical axes A of the light source assemblies 30A, 30B, and 30C and the support members 40A, 40B, and 40C can be adjusted with high accuracy, and as a result, the laser light L from the light source assemblies 30A, 30B, and 30C can be multiplexed with high accuracy. Before the light source assemblies 30A and the support members 40A are fixed to the base 20, the inclination angles and positions of the optical axes A of the light source assemblies 30B, 30C and the support members 40B, 40C may be adjusted, and after the inclination angles and positions of the optical axes A of the light source assemblies 30A, 30B, 30C and the support members 40A, 40B, 40C are adjusted, the fixing step may be performed for the light source assemblies 30A, 30B, 30C and the support members 40A, 40B, 40C.

In the light source unit 10, the light source assembly 30A and the support 40A are configured such that the receiving surface 42 has a portion (outer portion 42a) located on the side away from the contact portion with the holding member 33 over the entire circumference even when the holding member 33 is slid with respect to the receiving surface 42 to a position (position shown in FIG. 11) where the optical axis A is maximally inclined with respect to the central axis X of the openings 20a in a state where the holding member 33 is not coupled to the receiving surface 42. That is, in the state shown in FIG. 11, the outer portion 42a of the receiving surface 42 is exposed from the holding member 33 over the entire circumference (not covered by the holding member 33). In the light source unit 10, in a state where the holding member 33 is not coupled to the receiving surface 42, when the holding member 33 is slid with respect to the receiving surface 42 so that the optical axis A are gradually inclined with respect to the central axis X, as shown in FIG. 11, a boundary portion (base end portion) 37c of the extending portion 37 with the fixing portion 36 comes into contact with the inner surface of the support member 40A, thereby restricting the sliding of the holding member 33. That is, the light source assembly 30A and the support member 40A are configured such that the portion of the extending portion 37 (first portion 61) on the side opposite to the base 20 comes into contact with the support member 40A before the portion of the extending portion 37 on the side of the base 20 comes into contact with the support member 40A when the holding member 33 is slid with respect to the receiving surface 42 such that the optical axis A are gradually inclined with respect to the central axis X.

[Base Fixing Structure]

Figure 10:
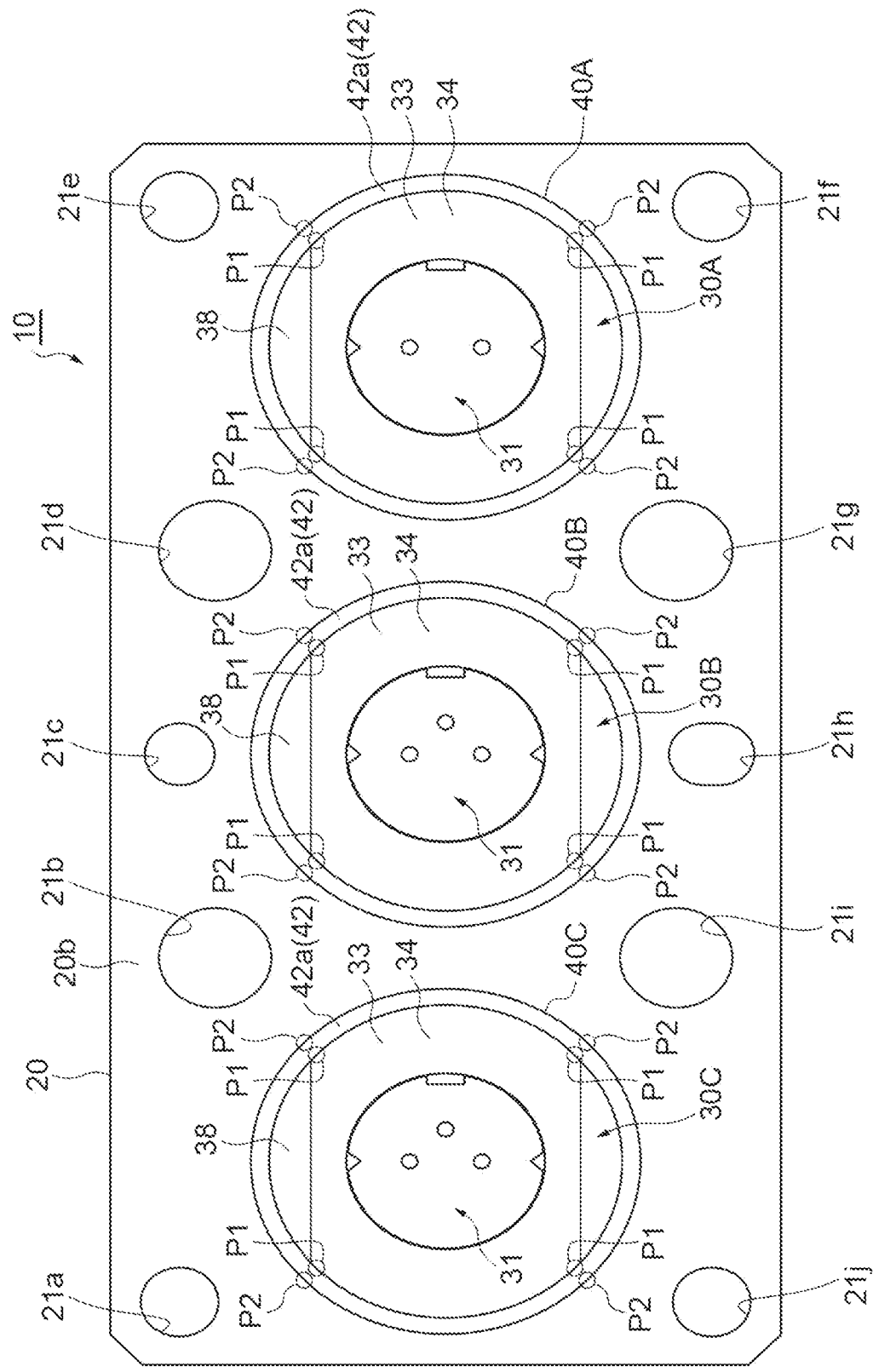
FIG. 10 is a view illustrating a light source unit as viewed from a direction parallel to an optical axis.

The fixing structure of the base 20 will be described with reference to FIG. 10. The base 20 is fixed to, for example, a predetermined housing (not shown) by a fastening member (not shown) such as a bolt. The base 20 is provided with a plurality of through holes 21a to 21j. When a direction in which the light source assemblies 30A, 30B, and 30C are arranged is defined as a first direction and a direction perpendicular to the first direction when viewed from the optical axis direction is defined as a second direction, the through holes 21a to 21e are arranged on one side in the second direction with respect to the light source assemblies 30A, 30B, and 30C, and the through holes 21f to 21j are arranged on the other side in the second direction with respect to the light source assemblies 30A, 30B, and 30C. In this example, the first direction is the longitudinal direction of the base 20, and the second direction is the short direction of the base 20. The through holes 21a to 21j may have different sizes or the same size.

In the present embodiment, the base 20 is fixed to the housing by fastening members at the through holes 21b, 21d, 21g, and 21i arranged around the light source assembly 30B. More specifically, bolts inserted through the through holes 21b, 21d, 21g, and 21i are fastened to fastening holes provided in the base 20, thereby fixing the base 20 to the housing.

Accordingly, it is possible to prevent the position of the optical axis A from deviating among the light source assemblies 30A, 30B, and 30C, and it is possible to improve the positional accuracy of the optical axis A of the laser light L. That is, for example, when the base 20 is fixed in the through holes 21a, 21e, 21f, and 21j disposed at the four corners of the base 20, the base 20 is warped due to the influence of heat or the like, and the angle of the optical axis A may be deviated among the light source assemblies 30A, 30B, and 30C. On the other hand, in the present embodiment, when the temperature of the base 20 rises, the portions of the base 20 outside the fixing positions (the positions of the through holes 21b, 21d, 21g, and 21i) are only deformed so as to extend outward in the first direction. Therefore, it is possible to suppress the angle of the optical axis A from deviating among the light source assemblies 30A, 30B, and 30C.

In order to achieve such a function and effect, the plurality of fixing positions of the base 20 with respect to the housing may include only pairs of fixing positions that sandwich one of the light source assemblies 30A, 30B, and 30C in the second direction. In other words, the plurality of fixing positions may include only pairs of fixing positions that do not sandwich two or more of the light source assemblies 30A, 30B, and 30C in the second direction. As another example, the fixing position may be the position of the through holes 21a and 21j. The fixing position may be the position of the through holes 21b and 21j. The fixing positions may be the positions of the through holes 21c and 21h. The fixing positions may be the positions of the through holes 21d, 21e, 21f, and 21g.

[Fixing Structure of Dichroic Mirror]

Figure 4:
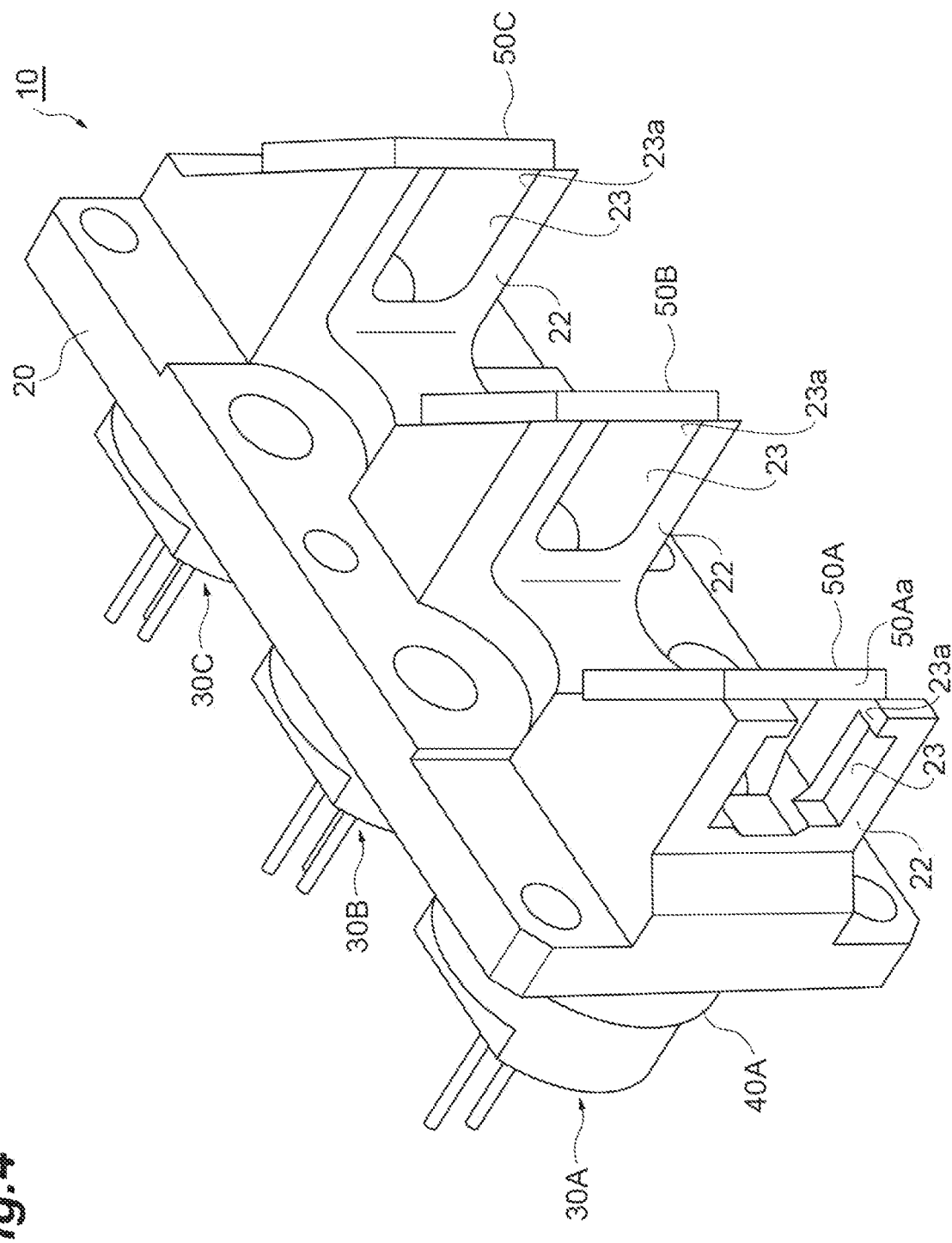
FIG. 4 is a perspective view of the light source unit as viewed from the other side.

The fixing structure of the dichroic mirrors 50A, 50B, and 50C will be described with reference to FIG. 4, etc. The dichroic mirrors 50A, 50B, and 50C are fixed to the base 20 on the side opposite to the light source assemblies 30A, 30B, and 30C with respect to the base 20. The base 20 is provided with a plurality of fixing portions 22 for fixing the dichroic mirrors 50A, 50B, and 50C. As described above, the dichroic mirrors 50A, 50B, and 50C are bonded to the fixing portion 22 by resin.

The fixed portion 22 is provided with a light passing portion 23 through which the laser light L reflected by the dichroic mirrors 50A, 50B, and 50C passes. The light passing portion 23 is open in the direction in which the laser light L is directed and is also open in the optical axis direction. That is, the light passing portion 23 has an opening portion 23a opened in the optical axis direction.

The dichroic mirror 50A is formed in, for example, a rectangular shape and is bonded to the fixing portion 22 at four sides thereof, but is not in contact with or bonded to the fixing portion 22 at an intermediate portion of the first side 50Aa corresponding to the opening portion 23a. The dichroic mirror 50A is not in contact with or bonded to the fixing portion 22 also in the intermediate portion of the second side 50Ab opposite to the first side 50Aa. In other words, the fixing portion 22 has a shape that does not contact the intermediate portion of the second side 50Ab of the dichroic mirror 50A.

As a result, it is possible to prevent the position of the dichroic mirror 50A from deviating, and it is possible to improve the positional accuracy of the dichroic mirror 50A. That is, for example, in a case where the dichroic mirror 50A is not bonded to the fixing portion 22 at the intermediate portion of the first side 50Aa but is bonded to the fixing portion 22 at the entire second side 50Ab, there is a concern that the bonding balance of the dichroic mirror 50A is lost between the first side 50Aa side and the second side 50Ab side, and the position of the dichroic mirror 50A is shifted. On the other hand, in the present embodiment, since the dichroic mirror 50A is not bonded to the fixing portion 22 at the intermediate portion of the second side 50Ab as well, the bonding balance of the dichroic mirror 50A can be improved, and as a result, the position of the dichroic mirror 50A can be prevented from being shifted. The dichroic mirrors 50B and 50C are also bonded to the fixing portion 22 in a similar manner with the dichroic mirror 50A, so that the positional accuracy is improved. The entire first side 50Aa may not be bonded to the fixing portion 22, and the entire second side 50Ab may not be bonded to the fixing portion 22.

[Function and Effects]

As described above, in the light source unit 10, the support member 40A has the convex receiving surface 42 extending along the spherical surface so as to surround the optical axis A when viewed from the optical axis direction. The light source assembly 30A is fixed to the support member 40A by coupling the holding member 33 to the receiving surface 42 at a contact portion with the receiving surface 42. When the light source unit 10 is manufactured, for example, the inclination of the light source assembly 30A can be adjusted by sliding the holding member 33 with respect to the receiving surface 42. The position of the light source assembly 30A can also be adjusted by sliding the support member 40A together with the light source assembly 30A with respect to the base 20. Therefore, the position of the optical axis A of the laser light L can be adjusted with high accuracy. Further, the receiving surface 42 has an outer portion 42a located on the side away from the optical axis A with respect to the coupling part P1 with the holding member 33. Accordingly, the holding member 33 can be easily coupled to the receiving surface 42, and the position of the optical axis A can be prevented from being displaced when the holding member 33 is coupled to the receiving surface 42. As described above, in the light source unit 10, the positional accuracy of the optical axis A of the laser light L is improved. Further, since the receiving surface 42 has the outer portion 42a, a welding margin between the holding member 33 and the receiving surface 42 can be sufficiently ensured, and the holding member 33 can be stably coupled to the receiving surface 42.

The holding member 33 has the cylindrical main body surrounding the optical axis A and the projecting portion 38 projecting from the main body so as to be away from the optical axis A, and is in contact with and coupled to the receiving surface 42 at the projecting portion 38. Thus, the position of the optical axis A of the laser light L can be adjusted more accurately, and the holding member 33 can be more easily coupled to the receiving surface 42.

The holding member 33 has the inclined surface 38a inclined with respect to the optical axis A, and is in contact with and coupled to the receiving surface 42 at the inclined surface 38a. Accordingly, the position of the optical axis A of the laser light L can be adjusted more accurately, and the holding member 33 can be more easily coupled to the receiving surface 42.

The holding member 33 is in line contact with the receiving surface 42. Accordingly, the position of the optical axis A of the laser light L can be adjusted more accurately, and the holding member 33 can be more easily coupled to the receiving surface 42. Further, since the contact area between the holding member 33 and the support member 40A is reduced, the heat generated by the light source 31 can be easily transmitted not to the base 20 side but to the heat dissipation member (not shown) disposed on the side opposite to the base 20. As a result, the heat generated by the light source 31 can be efficiently dissipated.

The holding member 33 is coupled to the receiving surface 42 by laser welding. In the light source unit 10, the holding member 33 can be easily coupled to the receiving surface 42 by laser welding.

The holding member 33 has the first part 61 disposed in the space S defined by the support member 40A. Thus, the light source unit 10 can be downsized. The holding member 33 has the second portion 62 disposed in the opening 20a of the base 20. Thus, the light source unit 10 can be further downsized.

The light source assembly 30A and the support member 40A are configured such that when the holding member 33 is slid with respect to the receiving surface 42 such that the optical axis A is gradually inclined with respect to the central axis X of the openings 20a in a state where the holding member 33 is not coupled to the receiving surface 42, a portion of the extending portion 37 (first portion 61) on a side opposite to the base 20 contacts the support member 40A before a portion of the extending portion 37 on the base 20 side contacts the support member 40A. Accordingly, when the inclination of the light source assembly 30A is adjusted by sliding the holding member 33 with respect to the receiving surface 42, the portion of the extending portion 37 on the base 20 side can be prevented from contacting the support member 40A. As a result, it is possible to prevent the position of the lens 32 held on the base 20 side in the holding member 33 from shifting.

The light source holder 34 is provided with the screw groove 37a, and the lens holder 35 is provided with the screw thread 35a to be screwed with the screw groove 37a so that the light source holder 37 and the lens holder 35 are relatively movable in the optical axis direction. Accordingly, when the light source unit 10 is manufactured, the distance between the light source 31 and the lens 32 in the optical axis direction can be adjusted by adjusting the amount of screwing between the screw groove 37a and the screw thread 35a.

Here, with reference to FIGS. 12A and 12B, an advantage of fixing the light source holder 37 and the lens holder 35 by screwing the screw groove 37a and the screw thread 35a will be described. FIG. 12A is a diagram illustrating a case where the condensing distance of the lens is long, and FIG. 12B is a diagram illustrating a case where the condensing distance of the lens is short. For example, in a DVD pickup or the like, generally, as shown in FIG. 12B, a condensing distance D2 between the lens 132 and the condensing point R is as short as, for example, about several millimeters, and a ratio of the condensing distance D2 to a distance D1 between the light source 131 and the lens 132 is small. On the other hand, in the projection display device 1 as described above, as shown in FIG. 12S, the condensing distance D2 from the lens 32 to the condensing point R (light diffuser 4) is relatively long, for example, about 150 mm, and the ratio of the condensing distance D2 to the distance D1 between the light source 31 and the lens 32 is large. Therefore, in the projection display device 1 as described above, since the positional deviation of the lens 32 with respect to the light source 31 can appear at the condensing position as magnified several 10 times, extremely high accuracy is required for the position of the lens 32 with respect to the light source 31.

In this regard, as described above, in the light source assembly 30A, the light source holder 35 and the lens holder 37 are fixed by screwing the screw thread 37a and the screw groove 35a, so that the positional relationship between the light source 31 and the lens 32 can be adjusted with a resolution of about several μm. As a result, for example, positional accuracy of the lens 32 with respect to the light source 31 can be improved compared to fixing by curing of a UV resin or fixing by welding using a YAG laser. This is because the position of the lens 32 may vary due to expansion and contraction of the UV resin caused by a temperature change in the case of fixing with the UV resin, and in the case of welding using the YAG laser, the position deviation is likely to occur because the temperature of the welded portion becomes extremely high, and the required accuracy cannot be realized.

As described above, laser welding is used to fix the light source assembly 30A to the support member 40A and to fix the support member 40A to the base 20. However, high accuracy of about several jam is not required at these fixing portions. This is because the positional relationship between the light source 31 and the lens 32 is already fixed at the time of assembling the light source assembly 30A, and even if the position of the light source assembly 30A is shifted at the time of fixing to the base 20, the positional shift does not appear to be magnified many times. In the laser welding, positional deviation is less likely to occur even when a temperature change occurs after fixing, compared to fixing using resin.

In the light source unit 10, the distance L1 from the center of curvature C to the lens 32 on the optical axis A is shorter than the distance L2 from the light emitting point Q of the light source 31 to the lens 32 on the optical axis A. This makes it possible to reduce the amount of movement of the lens 32 when the inclination of the light source assembly 30A is adjusted by sliding the holding member 33 with respect to the receiving surface 42. When the amount of movement of the lens 32 in the inclination adjusting step is small, the amount of parallel movement of the support member 40A together with the light source assembly 30A in the position adjusting step can be reduced. As a result, the size of the light source unit 10 can be reduced.

The holding member 33 is made of the same material as the support member 40A. As a result, since the thermal expansion coefficients of the holding member 33 and the support member 40A are the same, it is possible to suppress the positional deviation between the holding member 33 and the support member 40A due to the change in the ambient temperature.

The dichroic mirror 50A is bonded to the base 20 by resin. This can simplify the manufacture of the light source unit 10. Since the heat generated by the light source 31 is hardly transmitted to the position where the dichroic mirror 50A is disposed, a resin can be used for coupling the dichroic mirror 50A to the base 20.

The light source assembly 30A and the support member 40A are configured such that the receiving surface 42 has a portion (outer portion 42a) located on the side away from the optical axis A with respect to the contact portion with the holding member 33 even when the holding member 33 is slid with respect to the receiving surface 42 to a position where the optical axis A is maximally inclined with respect to the central axis X of the openings 20a in a state the holding member 33 is not coupled to the receiving surface 42. Accordingly, the position of the optical axis A of the laser light L can be adjusted more accurately, and the holding member 33 can be more easily coupled to the receiving surface 42.

The receiving surface 42 has the outer portion 42a located outside the holding member 33 when viewed from the optical axis direction. Accordingly, the position of the optical axis A of the laser light L can be adjusted more accurately, and the holding member 33 can be more easily coupled to the receiving surface 42.

In a cross section including the optical axis A, the tangent line B of the receiving surface 42 at the contact point P3 between the holding member 33 and the receiving surface 42 forms an obtuse angle with an outer surface (in the above embodiment, the outer peripheral surface 38b of the protruding portion 38) continuous with the contact point P3 in the holding member 33. Accordingly, the position of the optical axis A of the laser light L can be adjusted more accurately, and the holding member 33 can be more easily coupled to the receiving surface 42.

As shown in FIG. 9, the fixing portion 36 to which the light source 31 is fixed has a portion 36b extending between the fixing portion of the light source 31 and the inclined surface 38a in the optical axis direction. Accordingly, the thickness of the fixing portion 36 in the direction perpendicular to the optical axis A can be increased, and the strength of the fixing portion 36 can be improved. Further, it is possible to prevent the temperature of the fixing portion 36 from increasing due to the heat from the light source 31.

As shown in FIG. 9, the protruding portion 38 includes a cylindrical first portion 38e and a second portion 38f protruding from the first portion 38e in the optical axis direction. The inclined surface 38a is provided in the second portion 38f. Accordingly, the thickness of the protruding portion 38 in the optical axis direction can be increased, and the strength of the protruding portion 38 can be improved. Further, it is possible to prevent the temperature of the protruding portion 38 from increasing due to heat from the light source 31. Thus, in combination with the fact that the holding member 33 is in line contact with the receiving surface 42, the heat generated by the light source 31 can be effectively prevented from being transmitted to the base 20 side.

In the above-described manufacturing method, the distance between the light source 31 and the lens 32 in the optical axis direction is adjusted by adjusting the amount of screwing between the light source holder 34 and the lens holder 35 (distance adjusting step). Accordingly, the positional relationship between the light source 31 and the lens 32 can be adjusted with high accuracy. After the inclination of the light source assembly 30A is adjusted by sliding the holding member 33 with respect to the receiving surface 42

(inclination adjusting step), the support member 40A is fixed to the base 20, and the light source assembly 30A is fixed to the support member 40A by coupling the holding member 33 to the receiving surface 42 at the contact portion with the receiving surface 42 (fixing step). Thus, each element can be fixed after the position of the optical axis A of the laser light L is accurately adjusted. Therefore, according to the above-described manufacturing method, it is possible to obtain the light source unit 10 in which the positional accuracy of the optical axis A of the laser light L is improved.

The above-described manufacturing method includes, between the disposing step and the fixing step, the position adjusting step of adjusting the position of the light source assembly 30A by sliding the support member 40A together with the light source assembly 30A with respect to the base 20. As a result, each element can be fixed after the position of the optical axis A of the laser light L is more accurately adjusted.

In the fixing step, the light source assembly 30A is fixed to the support member 40A by coupling the holding member 33 to the receiving surface 42 at the coupling-planned portion in a state in which the receiving surface 42 has the outer portion 42a located on the side away from the optical axis A with respect to the coupling-planned portion with the holding member 33. Thus, the positional accuracy of the optical axis A of the laser light L can be further enhanced.

In the fixing step, the light source assembly 30A is fixed to the support member 40A by coupling the holding member 33 to the receiving surface 42 at the contact portion with the receiving surface 42 by laser welding. According to the above-described manufacturing method, even when the holding member 33 is coupled to the receiving surface 42 by laser welding, the positional accuracy of the optical axis A of the laser light L can be improved.

[Modification]

Figure 13A:
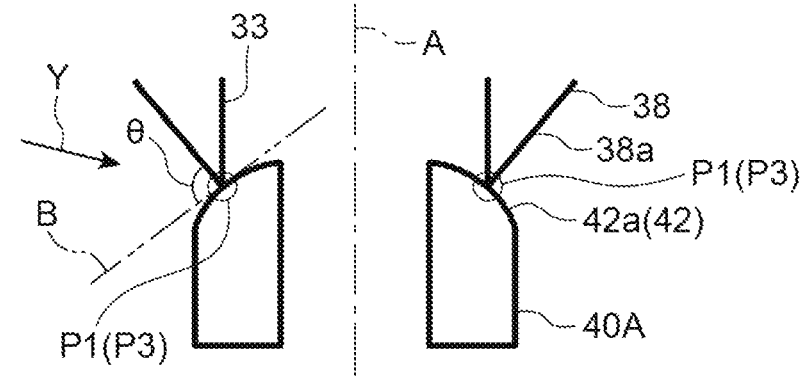
FIGS. 13A to 13C are schematic views illustrating modifications.
Figure 13B:
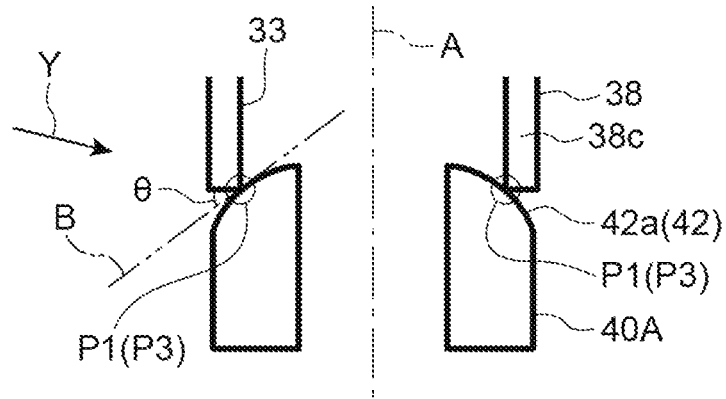
Figure 13C:
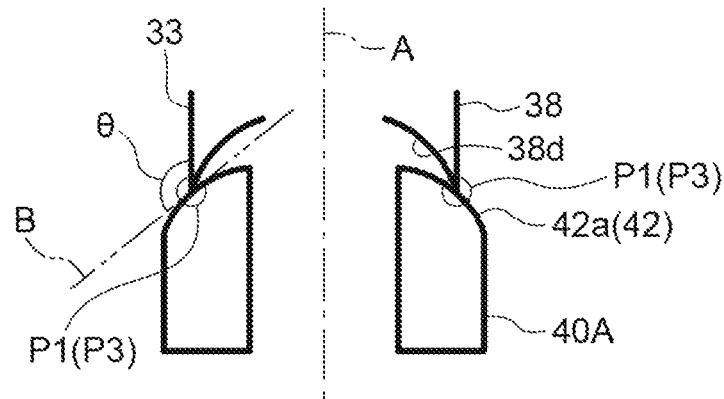
Figure 14A:
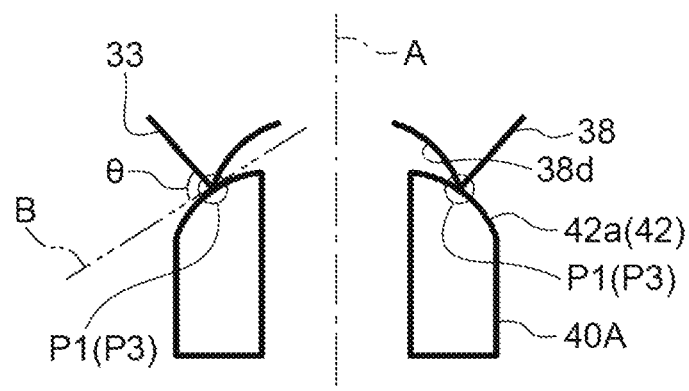
FIGS. 14A to 14C are schematic views illustrating modifications.
Figure 14B:
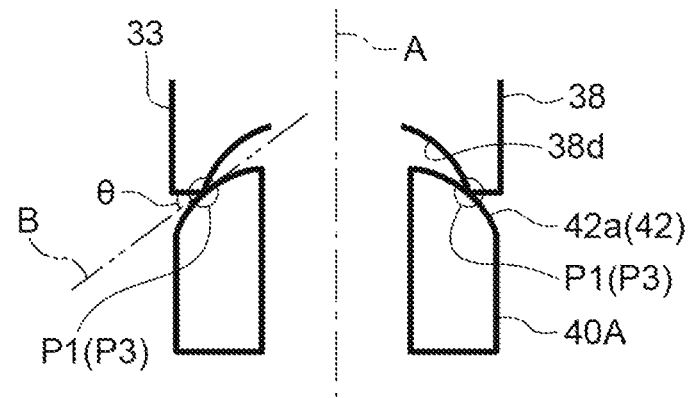
Figure 14C:
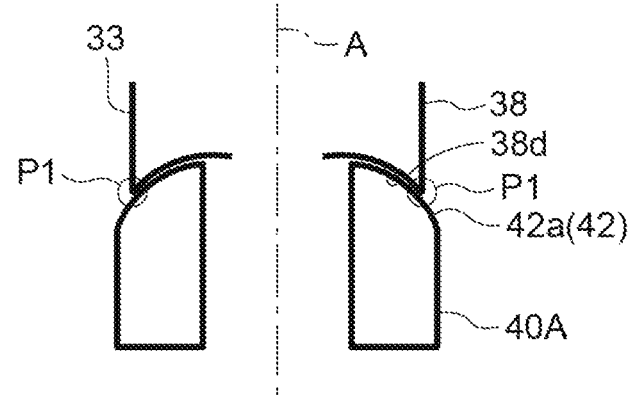

The light source assembly 30A and the support member 40A may be configured as in the first to third modifications shown in FIGS. 13A to 13C or the fourth to sixth modifications shown in FIGS. 14A to 14C. In FIGS. 13A to 13C and FIGS. 14A to 14C, the periphery of the protruding portion 38 of the holding member 33 and the receiving surface 42 of the support member 40A is schematically and partially shown.

In the first modification shown in FIG. 13A, the inclined surface 38a of the protruding portion 38 is inclined so as to go toward the side opposite to the light emission side (the side where the light source 31 is located with respect to the lens 32 in the optical axis direction) as the distance from the optical axis A increases. The holding member 33 is in contact with the receiving surface 42 at the inner edge of the inclined surface 38a. The receiving surface 42 has an outer portion 42a. The coupling part P1 of the holding member 33 to the receiving surface 42 overlaps the holding member 33 and is not exposed when viewed from the optical axis direction, but is exposed when viewed from the direction perpendicular to the optical axis A. The coupling part P1 is exposed when viewed from a direction Y slightly inclined to the side opposite to the light emission side with respect to the direction perpendicular to the optical axis A. That is, the coupling part P1 is exposed when viewed from a position away from a straight line orthogonal to the optical axis A and passing through the coupling part P1 toward the light emission side. In a cross section including the optical axis A, an angle θ formed by a tangent line B of the receiving surface 42 at a contact point P3 between the holding member 33 and the receiving surface 42 and an outer surface (in this example, the inclined surface 38a) continuous with the contact point P3 in the holding member 33 is an obtuse angle.

In the second modification shown in FIG. 13B, the protruding portion 38 does not have the inclined surface 38a but has a cylindrical portion 38c. The holding member 33 is in line contact with the receiving surface 42 at the inner edge of the distal end of the cylindrical portion 38c. The receiving surface 42 has an outer portion 42a. The coupling part P1 of the holding member 33 to the receiving surface 42 overlaps the holding member 33 and is not exposed when viewed from the optical axis direction, but is exposed when viewed from the direction perpendicular to the optical axis A. The coupling part P1 is not exposed when viewed from a direction Y slightly inclined to the side opposite to the light emission side with respect to the direction perpendicular to the optical axis A. In the cross section including the optical axis A, an angle θ formed by a tangent line B of the receiving surface 42 at a contact point P3 between the holding member 33 and the receiving surface 42 and an outer surface (in this example, a distal end surface of the cylindrical portion 38c) continuous with the contact point P3 in the holding member 38 is an acute angle.

In a third modification shown in FIG. 13C, the protruding portion 38 has a concave contact surface 38d extending along a spherical surface instead of the inclined surface 38a. The center of curvature of the contact surface 38d does not coincide with the center of curvature of the receiving surface 42. The holding member 33 is in line contact with the receiving surface 42 at the outer edge of the contact surface 38d. The receiving surface 42 has an outer portion 42a. The coupling part P1 of the holding member 33 to the receiving surface 42 is exposed both when viewed from the optical axis direction and when viewed from the direction perpendicular to the optical axis A. In a cross section including the optical axis A, an angle θ formed by a tangent line B of the receiving surface 42 at a contact point P3 between the holding member 33 and the receiving surface 42 and an outer surface (in this example, an outer peripheral surface of the protruding portion 38) continuous with the contact point P3 in the holding member 33 is an obtuse angle.

The fourth modification shown in FIG. 14A is different from the third modification in the outer shape of the protruding portion 38. The receiving surface 42 has an outer portion 42a. The coupling part P1 of the holding member 33 to the receiving surface 42 overlaps the holding member 33 and is not exposed when viewed from the optical axis direction, but is exposed when viewed from the direction perpendicular to the optical axis A. The coupling part P1 is exposed when viewed from a direction Y slightly inclined to the side opposite to the light emission side with respect to the direction perpendicular to the optical axis A. In a cross section including the optical axis A, an angle θ formed by a tangent line B of the receiving surface 42 at a contact point P3 between the holding member 33 and the receiving surface 42 and an outer surface (in this example, an outer surface of the protruding portion 38) continuous with the contact point P3 in the holding member 33 is an acute angle.

The fifth modification shown in FIG. 14B is different from the third modification in the outer shape of the protruding portion 38. The receiving surface 42 has an outer portion 42a. The coupling part P1 of the holding member 33 to the receiving surface 42 overlaps the holding member 33 and is not exposed when viewed from the optical axis direction, but is exposed when viewed from the direction perpendicular to the optical axis A. The coupling part P1 is not exposed when viewed from a direction Y slightly inclined to the side opposite to the light emission side with respect to the direction perpendicular to the optical axis A. In a cross section including the optical axis A, an angle θ formed by a tangent line B of the receiving surface 42 at a contact point P3 between the holding member 33 and the receiving surface 42 and an outer surface (in this example, a distal end surface of the protruding portion 38) continuous with the contact point P3 in the holding member 33 is an acute angle.

In a sixth modification shown in FIG. 14C, the protruding portion 38 has a contact surface 38d along a concave spherical surface instead of the inclined surface 38a. The center of curvature of the contact surface 38d coincides with the center of curvature of the receiving surface 42. The holding member 33 is in surface contact with the receiving surface 42 at the contact surface 38d. The holding member 33 is coupled to the receiving surface 42 at the outer edge of the contact surface 38d. Also in the sixth modification, the receiving surface 42 has an outer portion 42a. In the sixth modification, the coupling part P1 of the holding member 33 to the receiving surface 42 is exposed both when viewed from the optical axis direction and when viewed from the direction perpendicular to the optical axis A. According to the first to sixth modifications, the positional accuracy of the optical axis A of the laser light L can be improved as in the above embodiment.

The material and shape of each component are not limited to those described above, and various materials and shapes can be adopted. For example, in the above-described embodiment, the protruding portion 38 is disposed over the entire circumference of the outer circumferential surface of the fixing portion 36. However, the protruding portion 38 may be configured by a plurality of protruding portions arranged along the circumferential direction on the outer circumferential surface of the fixing portion 36. That is, the protruding portion 38 may be partially disposed in the circumferential direction. The holding member 33 may not contact and be coupled to the receiving surface 42 at the protrusion 38. For example, the end portion of the lens holder 35 on the base 20 side may be brought into contact with and coupled to the receiving surface 42. In this case, the holding member 33 may not be provided with the protruding portion 38. The center of curvature C of the receiving surface 42 may be located on the lens 32. When the receiving surface 42 has the outer portion 42a, an adjustment margin for position adjustment of the holding member 33 can be ensured, and the holding member 33 can be easily positioned.

The holding member 33 may be coupled to the receiving surface 42 by a welding means other than laser welding or an adhesive made of a resin material. The support member 40A may be coupled to the base 20 by a welding means other than laser welding or an adhesive made of a resin material. The coupling means of the holding member 33 to the receiving surface 42 may be different from the coupling means of the support member 40A to the base 20. In the above-described embodiment, the optical axes A of the light source assemblies 30A, 30B, and 30C are parallel to each other, but at least one optical axis A of the light source assemblies 30A, 30B, and 30C may intersect (for example, be orthogonal to) the optical axes A of the other light source assemblies 30A, 30B, and 30C. In this case, the base 20 (attaching surface 20b) may be formed in an L shape or a U shape when viewed from a direction perpendicular to the optical axis A. The holding member 33 may not be coupled to the receiving surface 42. In this case, the light source assembly 30A may be fixed to the base 20 by directly coupling the holding member 33 to the base 20 on the outer side of the support member 40A. The holding member 33 may be coupled to the receiving surface 42 at a portion of the receiving surface 42 on the inner side (the side closer to the optical axis A) of the contact point P3 between the holding member 33 and the receiving surface 42. For example, an adhesive made of a resin material may be applied to the inner portion (and the contact point P3), and the resin material may be heated and cured after assembly.

The receiving surface 42 may extend so as to surround the optical axis A, and may not necessarily surround the optical axis A over the entire circumference. For example, the receiving surface 42 may be discontinuous in a part of the circumferential direction by forming a notch or the like in the receiving surface 42. That is, the receiving surface 42 may partially surround the optical axis A and may extend around the optical axis A. The support member 40A may not be formed in a cylindrical shape and may be formed in a C-shape when viewed from the optical axis direction, for example. The receiving surface 42 may have a spherical shape. Such a spherical surface includes a spherical surface having different radius of curvature at a plurality of points due to manufacturing errors or the like. For example, the spherical surface may be a surface having a radius of curvature within a range of ±0.1 mm of a set value.

REFERENCE SIGNS LIST

1: projection display device, 4: light diffuser, 10: light source unit, 20: base, 20a: opening, 30A, 30B, 30C: light source assembly, 31: light source, 32: lens, 33: holding member, 34: light source holder, 35: lens holder, 35a: thread (second screwing part), 37a: thread groove (first screwing part), 38: protruding portion, 38a: inclined surface, 40A, 40B, 40C: support member, 42: receiving surface, 42a: outer portion, 50A, 50B, 50C: dichroic mirror, 61: first portion, 62: second portion, A: optical axis, B: tangent line, C: center of curvature, L: laser light, P1: coupling part, P3: contact point, X: center axis

The invention claimed is:

1. A light source unit comprising:
a base provided with an opening;
a support portion positioned on the base at the opening;
a light source assembly fixed to the support portion at the opening;
wherein the light source assembly includes a light source that emits laser light and a holding member that holds the light source,
the support portion has a receiving surface extending so as to surround the optical axis when viewed from a direction parallel to an optical axis of the laser light, the receiving surface being curved convexly toward a side away from the optical axis,
the light source assembly is fixed to the support portion by coupling the holding member to the receiving surface at a contact portion with the receiving surface,
the receiving surface has a portion located on a side away from the optical axis with respect to a coupling part with the holding member, and
the receiving surface is formed in a surface of the support portion opposite to the optical axis.

2. The light source unit according to claim 1, wherein the holding member includes a cylindrical main body surrounding the optical axis and a protruding portion protruding from the main body so as to be away from the optical axis, and is in contact with and coupled to the receiving surface at the protruding portion.

3. The light source unit according to claim 1, wherein the holding member has an inclined surface inclined with respect to the optical axis and is in contact with and coupled to the receiving surface at the inclined surface.

4. The light source unit according to claim 1, wherein the holding member is in line contact with the receiving surface.

5. The light source unit according to claim 1, wherein the holding member has a contact surface curved concavely, and is in contact with and coupled to the receiving surface at the contact surface.

6. The light source unit according to claim 1, wherein the holding member is coupled to the receiving surface by laser welding.

7. The light source unit according to claim 1, wherein the holding member has a first portion disposed in a space defined by the support portion.

8. The light source unit according to claim 7, wherein the holding member has a second portion disposed in the opening of the base.

9. The light source unit according to claim 7, wherein the light source assembly and the support portion are configured such that a portion of the first portion on a side opposite to the base contacts the support portion before a portion of the first portion on a side of the base contacts the support portion when the holding member is slid with respect to the receiving surface such that the optical axis is gradually inclined with respect to a central axis of the opening in a state where the holding member is not coupled to the receiving surface.

10. The light source unit according to claim 1, further comprising a lens disposed on the optical axis,
wherein the holding member holds the light source and the lens, the holding member includes a light source holder that holds the light source and a lens holder that holds the lens, and
the light source holder is provided with a first screw portion, and the lens holder is provided with a second screw portion that is screwed with the first screw portion so that the light source holder and the lens holder are relatively movable in a direction parallel to the optical axis.

11. The light source unit according to claim 10, wherein the receiving surface extends along a spherical surface, and
a distance from a center of curvature of the receiving surface to the lens on the optical axis is shorter than a distance from a light emitting point of the light source to the lens on the optical axis.

12. The light source unit according to claim 1, wherein the holding member is made of the same material as the support portion.

13. The light source unit according to claim 1, wherein the base includes an attaching surface,
the support portion is formed as a different member from the base and includes a sliding surface, and
the sliding surface is in contact with the attaching surface.

14. The light source unit according to claim 10, further comprising a dichroic mirror on which the laser light emitted from the lens is incident,
wherein the dichroic mirror is bonded to the base by resin.

15. The light source unit according to claim 1, wherein the light source assembly and the support portion are configured such that the receiving surface has a portion located on a side away from the optical axis with respect to a contact portion with the holding member over an entire circumference when the holding member is slid with respect to the receiving surface to a position where the optical axis is maximally inclined with respect to a central axis of the opening in a state where the holding member is not coupled to the receiving surface.

16. The light source unit according to claim 1, wherein the receiving surface includes a portion located outside the holding member when viewed from a direction parallel to the optical axis.

17. The light source unit according to claim 1, wherein in a cross section including the optical axis, a tangent line of the receiving surface at a contact point between the holding member and the receiving surface forms an obtuse angle with an outer surface of the holding member continuous with the contact point.

18. A projection display device comprising:
the light source unit according to claim 1; and
a light diffuser that transmits and diffuses the laser light emitted from the light source unit.

19. A method for manufacturing a light source unit, the method comprising:
a distance adjusting step of adjusting, in a holding member of a light source assembly including a light source that emits a laser light, a lens disposed on an optical axis of the laser light, and the holding member that holds the light source and the lens, a distance between the light source and the lens in a direction parallel to the optical axis of the laser light by adjusting a screwing amount between a light source holder holding the light source and a lens holder holding the lens;
a disposing step of disposing the light source assembly on a cylindrical support portion that is positioned on a base provided with an opening and includes a receiving surface, such that the holding member is in contact with the receiving surface, after the distance adjusting step, wherein the receiving surface extends so as to surround the optical axis when viewed from a direction parallel to the optical axis and is curved convexly toward a side away from the optical axis,
an inclination adjusting step of adjusting an inclination of the light source assembly by sliding the holding member with respect to the receiving surface, after the disposing step; and
a fixing step of fixing the light source assembly to the support portion at the opening by coupling the holding member to the receiving surface at a contact portion with the receiving surface, after the inclination adjusting step.

20. The method for manufacturing a light source unit according to claim 19, further comprising a position adjusting step of adjusting a position of the light source assembly by sliding the support portion together with the light source assembly with respect to the base, between the disposing step and the fixing step.

21. The method for manufacturing a light source unit according to claim 19, wherein in the fixing step, the light source assembly is fixed to the support portion by coupling the holding member to the receiving surface at a coupling-planned portion in a state where the receiving surface has a portion located on a side away from the optical axis with respect to the coupling-planned portion with the holding member.

22. The method for manufacturing a light source unit according to claim 19, wherein in the fixing step, the light source assembly is fixed to the support portion by coupling the holding member to the receiving surface at a contact portion with the receiving surface by laser welding.

* * * * *